US008872276B2

(12) United States Patent
Loechelt et al.

(10) Patent No.: US 8,872,276 B2
(45) Date of Patent: *Oct. 28, 2014

(54) ELECTRONIC DEVICE INCLUDING A TRANSISTOR AND A VERTICAL CONDUCTIVE STRUCTURE

(71) Applicant: Semiconductor Components Industries, LLC, Phoenix, AZ (US)

(72) Inventors: Gary H. Loechelt, Tempe, AZ (US); Gordon M. Grivna, Mesa, AZ (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 14/099,214

(22) Filed: Dec. 6, 2013

(65) Prior Publication Data

US 2014/0091399 A1 Apr. 3, 2014

Related U.S. Application Data

(60) Continuation of application No. 13/523,827, filed on Jun. 14, 2012, now Pat. No. 8,648,427, which is a division of application No. 12/495,250, filed on Jun. 30, 2009, now Pat. No. 8,222,695.

(51) Int. Cl.
*H01L 27/088* (2006.01)
*H01L 29/735* (2006.01)
(Continued)

(52) U.S. Cl.
CPC ........... *H01L 27/088* (2013.01); *H01L 21/2815* (2013.01); *H01L 29/735* (2013.01); *H01L 29/41766* (2013.01); *H01L 21/823828*
(Continued)

(58) Field of Classification Search
CPC ............... H01L 21/2815; H01L 29/66659; H01L 29/4175; H01L 29/7835; H01L 29/0878; H01L 29/10; H01L 29/1083; H01L 29/41708; H01L 29/6625; H01L 29/66689; H01L 29/66696; H01L 29/735
USPC ................. 257/373, 499, 500–502, 520, 392; 438/322, 203, 3
See application file for complete search history.

(56) References Cited

U.S. PATENT DOCUMENTS 4,258,379 A * 3/1981 Watanabe et al. ............. 257/574
4,285,116 A * 8/1981 Meguro ........................ 438/227
(Continued)

FOREIGN PATENT DOCUMENTS

WO 2007/118060 A2 10/2007

OTHER PUBLICATIONS

T. Hashimoto et al., "System in Package with Mounted Capacitor for Reduced Parasitic Inductance in Voltage Regulators", 2008, IEEE, pp. 187-191.

(Continued)

*Primary Examiner* — Fernando L Toledo
*Assistant Examiner* — Mohammed Shamsuzzaman
(74) *Attorney, Agent, or Firm* — Abel Law Group, LLP

(57) ABSTRACT

An electronic device, including an integrated circuit, can include a buried conductive region and a semiconductor layer overlying the buried conductive region, wherein the semiconductor layer has a primary surface and an opposing surface lying closer to the buried conductive region. The electronic device can also include a first doped region and a second doped region spaced apart from each other, wherein each is within the semiconductor layer and lies closer to primary surface than to the opposing surface. The electronic device can include current-carrying electrodes of transistors. A current-carrying electrode of a particular transistor includes the first doped region and is a source or an emitter and is electrically connected to the buried conductive region. Another current-carrying electrode of a different transistor includes the second doped region and is a drain or a collector and is electrically connected to the buried conductive region.

19 Claims, 25 Drawing Sheets

(51) Int. Cl.
*H01L 21/8238* (2006.01)
*H01L 27/092* (2006.01)
*H01L 29/10* (2006.01)
*H01L 21/768* (2006.01)
*H01L 29/78* (2006.01)
*H01L 29/66* (2006.01)
*H01L 21/28* (2006.01)
*H01L 29/417* (2006.01)
*H01L 29/40* (2006.01)
*H01L 29/06* (2006.01)
*H01L 29/423* (2006.01)

(52) U.S. Cl.
CPC (2013.01); *H01L 21/823892* (2013.01); *H01L 27/092* (2013.01); *H01L 21/823814* (2013.01); *H01L 29/4175* (2013.01); *H01L 29/10* (2013.01); *H01L 29/41708* (2013.01); *H01L 29/402* (2013.01); *H01L 21/76895* (2013.01); *H01L 29/1083* (2013.01); *H01L 29/7835* (2013.01); *H01L 29/7816* (2013.01); *H01L 29/6625* (2013.01); *H01L 29/66696* (2013.01); *H01L 29/0649* (2013.01); *H01L 29/0653* (2013.01); *H01L 29/66689* (2013.01); *H01L 29/66659* (2013.01); *H01L 29/42376* (2013.01)
USPC .......... 257/392; 257/373; 257/499; 257/500; 257/501; 257/502; 438/322; 438/203; 438/3

(56) References Cited

U.S. PATENT DOCUMENTS

| | | | | |
|---|---|---|---|---|
| 4,599,635 A * | 7/1986 | Itoh et al. | | 257/574 |
| 4,615,104 A * | 10/1986 | Kameyama et al. | | 438/430 |
| 4,661,838 A * | 4/1987 | Wildi et al. | | 257/336 |
| 4,763,181 A * | 8/1988 | Tasch, Jr. | | 257/300 |
| 4,862,240 A * | 8/1989 | Watanabe et al. | | 257/370 |
| 4,881,107 A * | 11/1989 | Matsushita | | 257/338 |
| 4,901,129 A * | 2/1990 | Hynecek | | 257/223 |
| 4,918,502 A * | 4/1990 | Kaga et al. | | 257/304 |
| 4,992,841 A * | 2/1991 | Halvis | | 257/221 |
| 5,060,044 A * | 10/1991 | Tomassetti | | 257/370 |
| 5,070,381 A * | 12/1991 | Scott et al. | | 257/558 |
| 5,151,378 A * | 9/1992 | Ramde | | 438/322 |
| 5,157,544 A * | 10/1992 | Nitta | | 359/344 |
| RE34,158 E * | 1/1993 | Watanabe et al. | | 257/42 |
| 5,182,469 A * | 1/1993 | Farley et al. | | 327/534 |
| 5,204,277 A * | 4/1993 | Somero et al. | | 438/366 |
| 5,218,228 A * | 6/1993 | Williams et al. | | 257/593 |
| 5,225,365 A * | 7/1993 | Cosentino | | 438/208 |
| 5,278,084 A * | 1/1994 | Lee et al. | | 438/207 |
| 5,290,714 A * | 3/1994 | Onozawa | | 438/207 |
| 5,559,044 A | 9/1996 | Williams et al. | | |
| 5,841,197 A * | 11/1998 | Adamic, Jr. | | 257/777 |
| 5,939,755 A | 8/1999 | Takeuchi et al. | | |
| 6,124,179 A * | 9/2000 | Adamic, Jr. | | 438/309 |
| 6,365,447 B1 * | 4/2002 | Hebert et al. | | 438/203 |
| 6,518,138 B2 | 2/2003 | Hsing | | |
| 6,559,505 B1 * | 5/2003 | Fallica | | 257/350 |
| 6,730,585 B2 * | 5/2004 | Disney | | 438/558 |
| 6,764,940 B1 | 7/2004 | Rozbicki et al. | | |
| 6,787,437 B2 * | 9/2004 | Rumennik et al. | | 438/526 |
| 6,890,804 B1 | 5/2005 | Shibib et al. | | |
| 6,927,442 B2 * | 8/2005 | Kaneko et al. | | 257/299 |
| 6,949,432 B2 | 9/2005 | Blanchard | | |
| 7,256,119 B2 | 8/2007 | Grivna et al. | | |
| 7,276,747 B2 | 10/2007 | Loechelt et al. | | |
| 7,391,080 B2 | 6/2008 | Arnborg et al. | | |
| 7,439,583 B2 | 10/2008 | Hshieh | | |
| 7,446,375 B2 | 11/2008 | Xu et al. | | |
| 7,566,931 B2 | 7/2009 | Kocon | | |
| 7,868,379 B2 | 1/2011 | Loechelt | | |
| 7,902,017 B2 | 3/2011 | Loechelt | | |
| 7,989,857 B2 | 8/2011 | Loechelt | | |
| 8,076,716 B2 | 12/2011 | Loechelt | | |
| 8,202,775 B2 | 6/2012 | Loechelt | | |
| 8,222,695 B2 | 7/2012 | Loechelt et al. | | |
| 8,299,560 B2 * | 10/2012 | Loechelt et al. | | 257/499 |
| 8,519,474 B2 | 8/2013 | Loechelt | | |
| 8,530,304 B2 | 9/2013 | Coppens et al. | | |
| 2003/0134481 A1 | 7/2003 | Fallica | | |
| 2003/0219952 A1 * | 11/2003 | Fujimaki | | 438/322 |
| 2004/0099878 A1 * | 5/2004 | Huang et al. | | 257/170 |
| 2005/0056898 A1 * | 3/2005 | Kaneko et al. | | 257/373 |
| 2007/0278516 A1 | 12/2007 | Hashimoto et al. | | |
| 2008/0122025 A1 * | 5/2008 | Roggenbauer et al. | | 257/501 |
| 2008/0197411 A1 | 8/2008 | Korec et al. | | |
| 2008/0242029 A1 * | 10/2008 | Wu et al. | | 438/270 |
| 2008/0246086 A1 | 10/2008 | Korec et al. | | |
| 2010/0148245 A1 * | 6/2010 | Loechelt | | 257/328 |
| 2010/0155836 A1 | 6/2010 | Hebert | | |
| 2012/0319188 A1 * | 12/2012 | Coppens et al. | | 257/327 |

OTHER PUBLICATIONS

Adriaan W. Ludikhuize "Self-aligned and Shielded-Resurf LDMOS for dense 20V Power IC's". The 11th International Symposium on Power Semiconductor Devices and ICs, (ISPSD99), Toronto, Canada, May 26-28, 1999, pp. 81-84.

Wayne Burger et al., "RF-LDMOS: A Device Technology for High Power RF Infrastructure Applications", IEEE CSIC Digest, 2004, pp. 189-192.

Peter Hazucha, et al., "A 233-MHz 80%-87% Efficient Four-Phase DC-DC Converter Utilizing Air-Core Inductors on Package", IEEE Journal of Solid State Circuits, vol. 40, No. 4, April 2005, pp. 838-845.

Gerhard Schrom et al., "A 480-MHZ, Multi-Phase Interleaved Buck DC-DC Converter with Hysteretic Control", Circuit Research, Intel Labs, Hillsboro, OR, USA, IEEE, 2004, pp. 4702-4707.

* cited by examiner

ELECTRONIC DEVICE INCLUDING A TRANSISTOR AND A VERTICAL CONDUCTIVE STRUCTURE

RELATED APPLICATION

This application is a continuation of and claims priority under 35 U.S.C. §120 to U.S. patent application Ser. No. 13/523,827 entitled "Electronic Device Including an Integrated Circuit With Transistors Coupled to Each Other" by Loechelt filed Jun. 14, 2012, which is a divisional of and claims priority under 35 U.S.C. §120 to U.S. patent application Ser. No. 12/495,250, entitled "Electronic Device Including an Integrated Circuit With Transistors Coupled to Each Other" by Loechelt filed Jun. 30, 2009, now U.S. Pat. No. 8,222,695 issued Jul. 17, 2012, both applications of which are assigned to the current assignee hereof and incorporated herein by reference in their entireties.

FIELD OF THE DISCLOSURE

The present disclosure relates to electronic devices and processes of forming electronic devices, and more particularly to, electronic devices including transistors and vertical conductive structures and processes of forming the same.

RELATED ART

Metal-oxide semiconductor field effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

When a MOSFET is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

In a particular application, a pair of power transistors can be used to allow an output to switch between two different voltages. The output can be connected to a source of a high-side power transistor and to a drain of a low-side power transistor. When the high-side power transistor is activated, the output will be at a voltage corresponding to the voltage on a drain of the high-side power transistor, and when the low-side power transistor is activated, the output will be at a voltage corresponding to a source of the low-side power transistor. In a particular physical embodiment, the high-side power transistor and the low-side power transistor are typically discrete transistors on separate dies that are interconnected to each other by bonded wire or other similar interconnects. The interconnects increase the parasitic characteristics of the electronic device, including the high-side and low-side power transistors, which are undesired.

BRIEF DESCRIPTION OF THE DRAWINGS

Embodiments are illustrated by way of example and are not limited in the accompanying figures.

Figure 1:
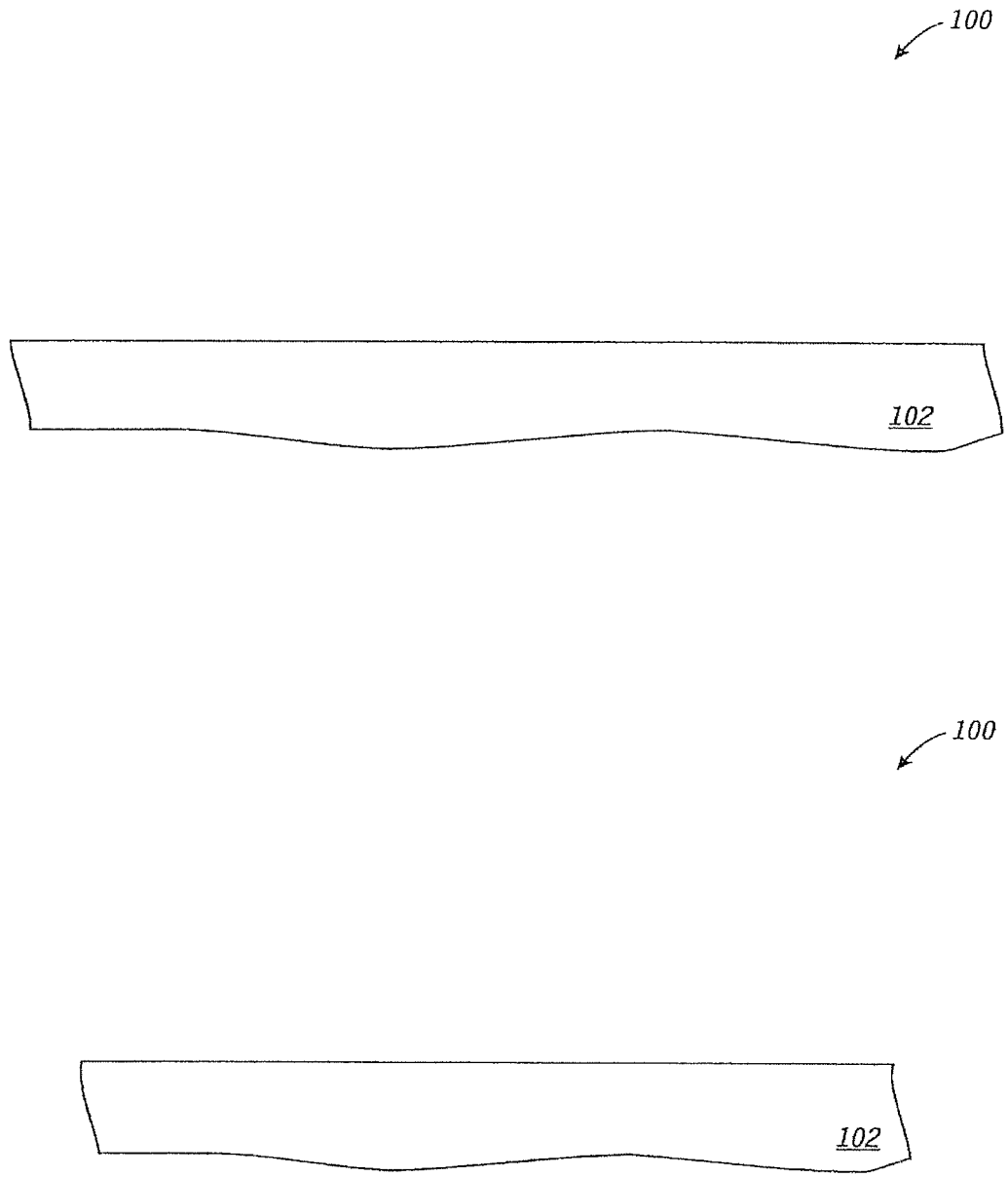
FIG. 1 includes an illustration of a cross-sectional view of a portion of a workpiece that includes a buried conductive region.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the terms "horizontally-oriented" and "vertically-oriented," with respect to a region or structure, refers to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor is designed to normally operate at least a 10 V difference to be maintained between the source and drain or emitter and collector of the transistor. For example, when the transistor is in an off-state, a 10 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the *CRC Handbook of Chemistry and Physics,* 81$^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

In the figures that follow, two different portions of a workpiece are illustrated to improve understanding of the effect of processing operations when forming different types of transistors on the same workpiece. The transistors will be part of the same integrated circuit. The illustrations closer to the top of the figures correspond to a high-side power transistor, and the illustrated closer to the bottom of the same figures correspond to a low-side power transistor.

FIG. 1 includes an illustration of a cross-sectional view of a portion of a workpiece 100 that includes a buried conductive region 102. The buried conductive region 102 can include a Group 14 element (i.e., carbon, silicon, germanium, or any combination thereof) and can be heavily n-type or p-type doped. For the purposes of this specification, heavily doped is intended to mean a peak dopant concentration of at least $10^{19}$ atoms/cm$^3$, and lightly doped is intended to mean a peak dopant concentration of less than $10^{19}$ atoms/cm$^3$. The buried conductive region 102 can be a portion of a heavily doped substrate (e.g., a heavily n-type doped wafer) or may be a buried doped region overlying a substrate of opposite conductivity type or overlying a buried insulating layer (not illustrated) that lies between a substrate and the buried conductive region 102. In an embodiment, the buried conductive region 102 is heavily doped with an n-type dopant, such as phosphorus, arsenic, antimony, or any combination thereof. In a particular embodiment, the buried conductive region 102 includes arsenic or antimony if diffusion of the buried conductive region 102 is to be kept low, and in a particular embodiment, the buried conductive region 102 includes antimony to reduce the level of autodoping (as compared to arsenic) during formation of a subsequently-formed semiconductor layer. The buried conductive region 102 will be used to electrically connect the source of the high-side power transistor and the drain of the low-side power transistor together and be part of an output node for the electronic device.

Figure 2:
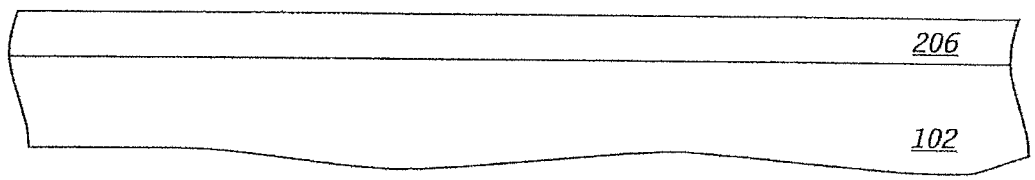
FIG. 2 includes an illustration of a cross-sectional view of the workpiece of FIG. 1 after forming a buried doped region for a high-side power transistor.
Figure 2:
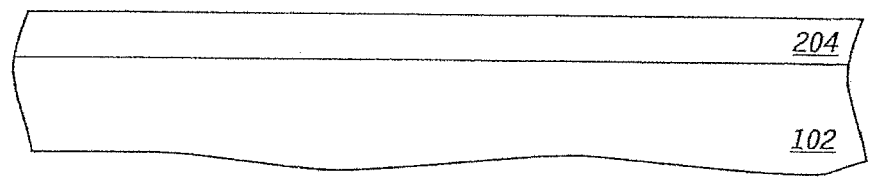

Referring to FIG. 2, a semiconductor layer 204 is formed over the buried conductive region 102. The semiconductor layer 204 can include a Group 14 element (i.e., carbon, silicon, germanium, or any combination thereof) and any of the dopants as described with respect to the buried conductive region 102 or dopants of the opposite conductivity type. In an embodiment, the semiconductor layer 204 is a lightly doped n-type or p-type epitaxial silicon layer having a thickness in a range of approximately 0.2 microns to approximately 2.0 micron, and a doping concentration no greater than approximately $10^{17}$ atoms/cm$^3$, and in another embodiment, a doping concentration of at least approximately $10^{14}$ atoms/cm$^3$. The semiconductor layer 204 is formed over all of the workpiece 100.

A portion of the semiconductor layer 204 within the high-side power transistor is heavily doped with dopant of opposite conductivity type as compared to the buried conductive region 102 to form a buried doped region 206. The buried doped region 206 can help with isolation within the high-side power transistor and reduce parasitic characteristics of the high-side power transistor. In a particular embodiment, the buried doped region 206 has a peak dopant concentration of at least approximately $10^{18}$ atoms/cm$^3$ of a p-type dopant.

Figure 3:
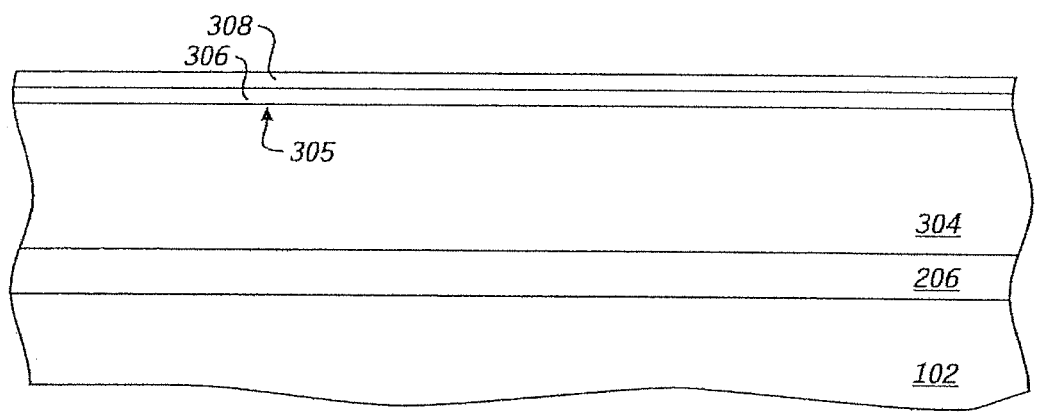
FIG. 3 includes an illustration of a cross-sectional view of the workpiece of FIG. 2 after forming a semiconductor layer, a pad layer, and a stopping layer.
Figure 3:
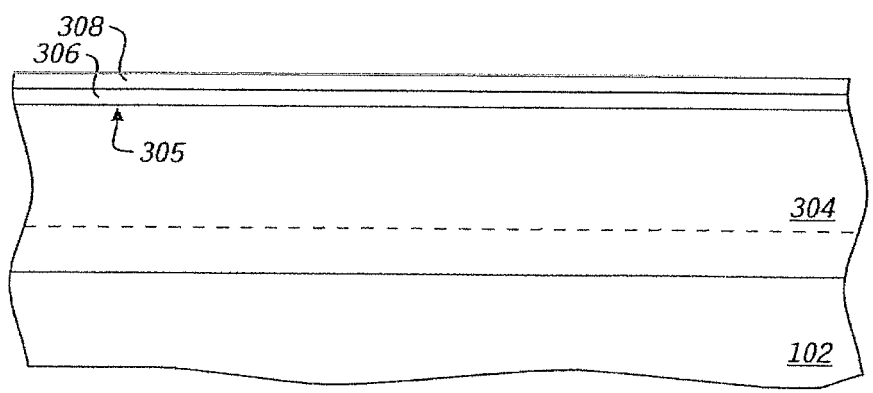

Referring to FIG. 3, a semiconductor layer 304 is formed over the semiconductor layer 204 (not labeled in FIG. 3) and buried doped region 206. In a particular embodiment, the semiconductor layers 204 and 304 have the same conductivity type and both are lightly doped. Thus, the dashed line within the illustration of the low-side power transistor in FIG. 3, illustrates an approximate location where the semiconductor layer 204 ends and the semiconductor layer 304 starts. The semiconductor layer 304 has a primary surface 305. The semiconductor layer 304 can include a Group 14 element (i.e., carbon, silicon, germanium, or any combination thereof) and any of the dopants as described with respect to the buried conductive region 102 or dopants of the opposite conductivity type. In an embodiment, the semiconductor layer 304 is a lightly doped n-type or p-type epitaxial silicon layer having a thickness in a range of approximately 0.5 microns to approximately 5.0 microns, and a doping concentration no greater than approximately $10^{17}$ atoms/cm$^3$, and in another embodiment, a doping concentration of at least approximately $10^{14}$ atoms/cm$^3$. The dopant concentration within the semiconductor layer 304 as formed or before selectively doping regions within the semiconductor layer 304 will be referred to as the background dopant concentration. In subsequent illustrations of the low-side power transistor, the combination of the semiconductor layers 204 and 304 will be referred to as the semiconductor layer 304 and will not include a dashed line.

A pad layer 306 and a stopping layer 308 (e.g., a polish-stop layer or an etch-stop layer) are sequentially formed over the semiconductor layer 304 using a thermal growth technique, a deposition technique, or a combination thereof. Each of the pad layer 306 and the stopping layer 308 can include an oxide, a nitride, an oxynitride, or any combination thereof. In an embodiment, the pad layer 306 has a different composition as compared to the stopping layer 308. In a particular embodiment, the pad layer 306 includes an oxide, and the stopping layer 308 includes a nitride.

Figure 4:
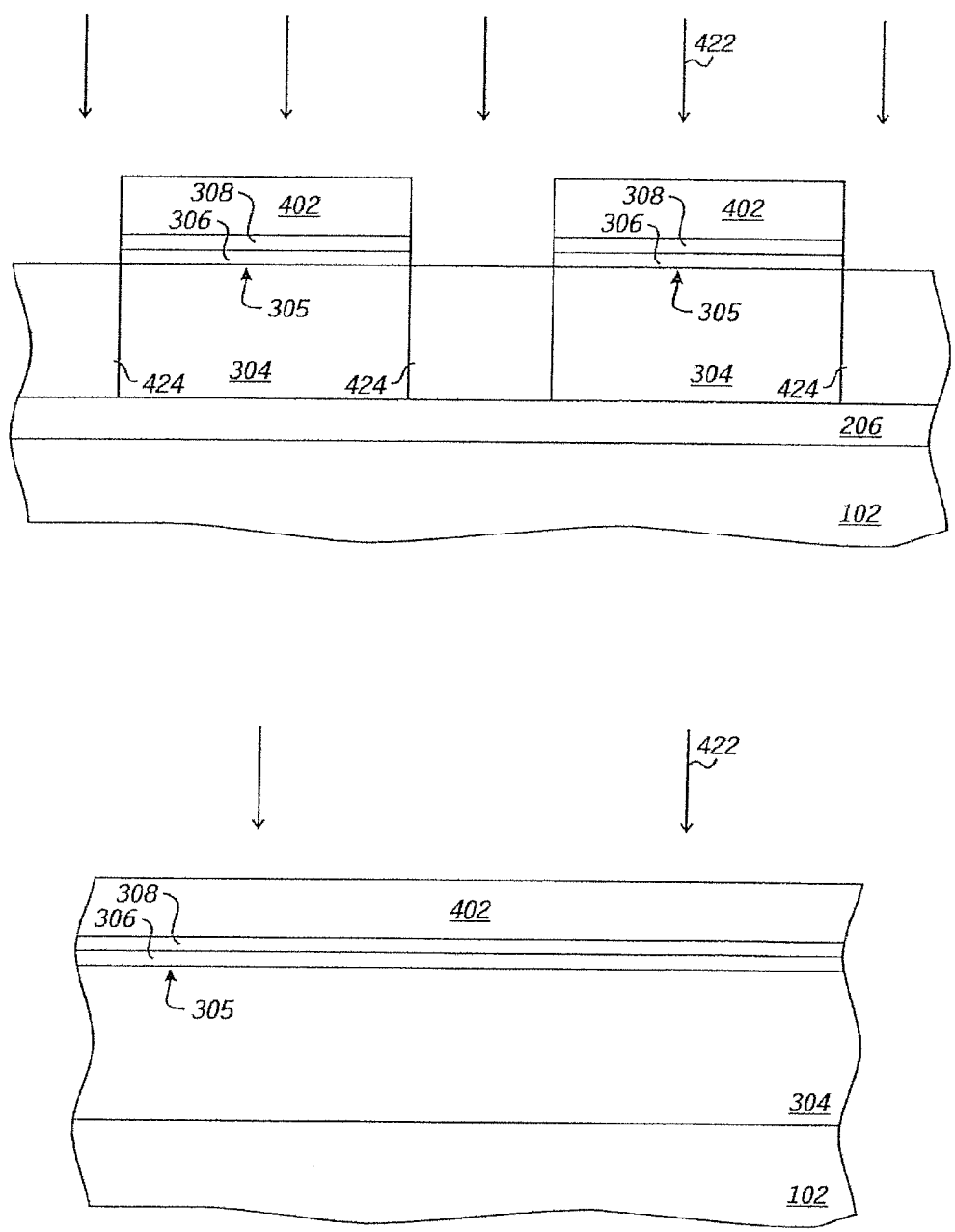
FIG. 4 includes an illustration of a cross-sectional view of the workpiece of FIG. 3 after patterning portions of the pad and stopping layers and forming vertical isolation regions.

Referring to FIG. 4, a patterned masking layer 402 is formed over the stopping layer 308. Openings within the patterned masking layer 402 are formed where vertical isolation regions will be formed. The vertical isolation regions are formed where the high-side power transistor is being formed. Thus, the patterned masking layer 402 covers substantially all of the stopping layer 308 where the low-side power transistor is being formed. In a particular embodiment, exposed portions of the pad layer 306 and stopping layer 308 are removed to expose portions of the semiconductor layer 304. In another embodiment (not illustrated), exposed portions pad layer 306 or both the pad layer 306 and stopping layer 308 are not etched. The presence of the pad layer 306 or both the pad layer 306 and stopping layer 308 may help to reduce implant channeling during a subsequent implant.

Portions of the semiconductor layer 304 under the openings in the patterned masking layer 402 are implanted (as illustrated by arrows 422) to form vertical isolation regions 424. The implantation may be performed as a single implant or as a plurality of implants. When a plurality of implants is performed, different energies, different species, or different energies and species may be used to form the vertical isolation regions 424. The conductivity type of the vertical isolation regions 424 can be the same as the buried doped region 206 and opposite that of the buried conductive region 102. In a particular embodiment, the vertical isolation regions 424 are p-type and have a dopant concentration of at least approximately $10^{18}$ atoms/cm$^3$. The combination of the vertical isolation regions 424 and buried doped region 206 help to isolate the portions of the semiconductor layer 304 within the high-side power transistor. After the implant, the patterned masking layer 402 is removed. In another embodiment described later in this specification, the vertical isolation regions can be formed using other techniques.

Another patterned masking layer (not illustrated) is formed over locations where the pad layer 306 and the stopping layer 308 are to be removed and trenches subsequently formed. At this point in the process, the pad layer 306 and stopping layer 308 are patterned within the low-side power transistor. If the pad layer 306 or both the pad layer 306 and stopping layer 308 have not been patterned within the high-side power transistor, the pad layer 306 or both the pad layer and stopping layer 308 within the high-side power transistor can be patterned with the corresponding portions within the low-side power transistor. After the pad layer 306 and stopping layer 308 have been patterned within the low-side power transistor (and possibly the high-side power transistor), the other patterned masking layer is removed.

Figure 5:
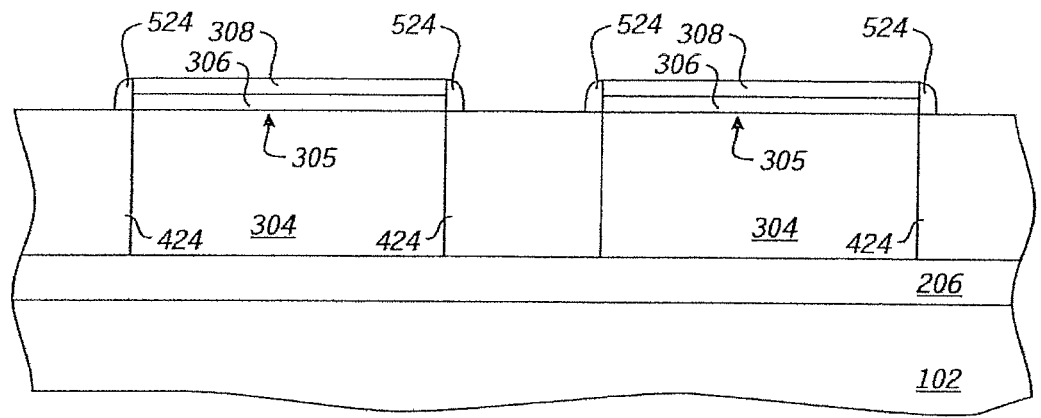
FIG. 5 includes an illustration of a cross-sectional view of the workpiece of FIG. 4 after patterning other portions of the pad and stopping layers and forming sidewall spacers.
Figure 5:
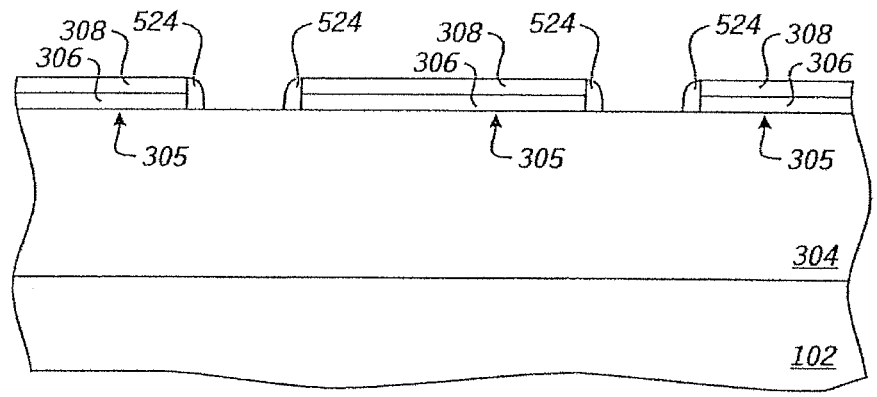

Sidewall spacers 524 are formed as illustrated in FIG. 5. The sidewall spacers 524 can be used to determine the widths of the subsequently-formed trenches and remaining portions of the vertical isolation regions 424 lying along sidewalls of the subsequently-formed trenches. The sidewall spacers 524 can be formed by depositing a sacrificial layer and anisotropically etching that layer. In a particular embodiment, the sacrificial layer can include an oxide, a nitride, an oxynitride, or any combination thereof. In a more particular embodiment, the sacrificial layer and the stopping layer 308 have different compositions. The thickness of the sacrificial layer may be no greater than approximately 900 nm or approximately 700 nm, or may be at least approximately 50 nm or approximately 100 nm.

Figure 6:
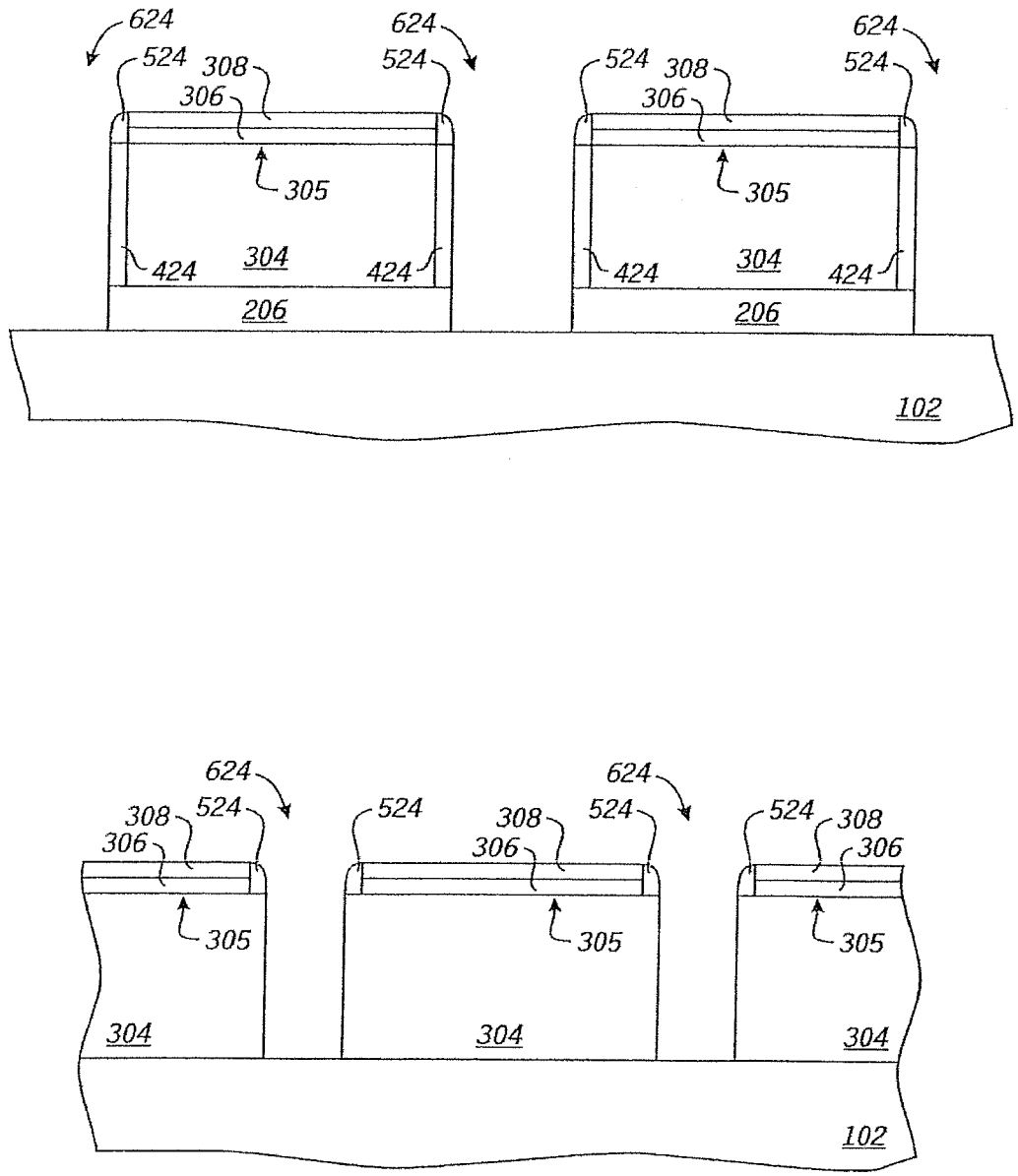
FIG. 6 includes an illustration of a cross-sectional view of the workpiece of FIG. 5 after forming trenches extending through a semiconductor layer toward the buried conductive region.

Exposed portions of the semiconductor layer 304 and, within the high-side power transistor, portions of the vertical isolation regions 424 and the buried doped regions 206 are etched to form trenches 624 that extend from the primary surface 305 toward the buried conductive region 102, as illustrated in FIG. 6. The trenches 624 may extend partly or completely through the semiconductor layer 304 or buried doped region 206. The widths of the trenches 624 are not so wide that a subsequently-formed conductive layer is incapable of filling the trenches 624. In a particular embodiment, the widths of each trenches 624 is at least approximately 0.3 micron or approximately 0.5 micron, and in another particular embodiment, the width of each trenches 624 is no greater than approximately 4 microns or approximately 2 microns. After reading this specification, skilled artisans will appreciate that narrower or wider widths outside the particular dimensions described may be used. The trenches 624 can extend to the buried conductive region 102; however, the trenches 624 may be shallower if needed or desired. The trenches 624 are formed using an anisotropic etch. In an embodiment, a timed etch can be performed, and in another embodiment, a combination of endpoint detection (e.g., detecting the dopant species from the buried conductive region 102, such as arsenic or antimony) and a timed overetch may be used.

Figure 7:
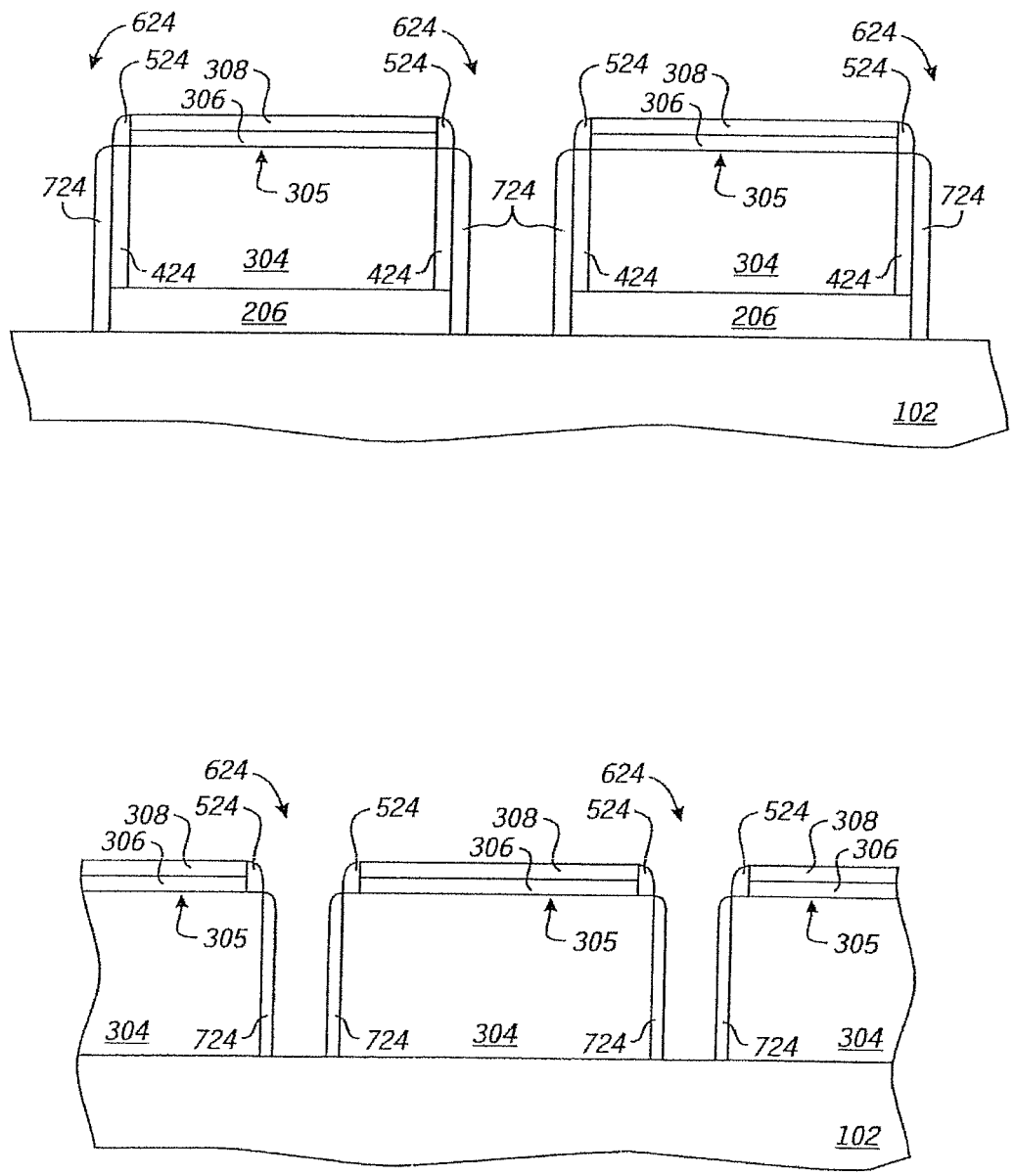
FIG. 7 includes an illustration of a cross-sectional view of the workpiece of FIG. 6 after forming insulating spacers within the trenches.

Insulating sidewall spacers 724 can be formed along the exposed sidewalls of the trenches 624, as illustrated in FIG. 7. The insulating sidewall spacers 724 can include an oxide, a nitride, an oxynitride, or any combination thereof. The layer from which the insulating sidewall spacers 724 are formed can be thermally grown or deposited, and the layer can be anisotropically etched to remove the layer from the bottoms of the trenches 624. If needed or desired, an etch can be performed to extend the trenches 624 closer to or further into the buried conductive region 102. In another embodiment, the insulating sidewall spacers 724 are not needed or are not formed within all trenches within the high-side or low-side power transistors. In a particular embodiment, the insulating sidewall spacers 724 may only be used within the trenches 624 of the low-side power transistor, and not used within the trenches 624 of the high-side power transistor. In another particular embodiment, the insulating sidewall spacers 724 may only be used within the trenches 624 of the high-side power transistor, and not used within the trenches 624 of the low-side power transistor.

A conductive layer is formed over the stopping layer 308 and within the trenches 624, and, in a particular embodiment, the conductive layer substantially fills the trenches 624. The conductive layer can be polycrystalline and include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive fill material can include tungsten or tungsten silicide. In a more particular embodiment, the conductive layer can include Ti/TiN/WSi. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

Figure 8:
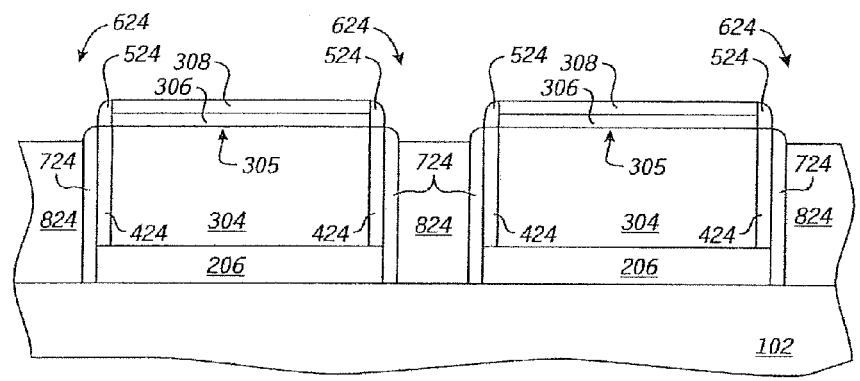
FIG. 8 includes an illustration of a cross-sectional view of the workpiece of FIG. 7 after forming recessed conductive structures within the trenches.
Figure 8:
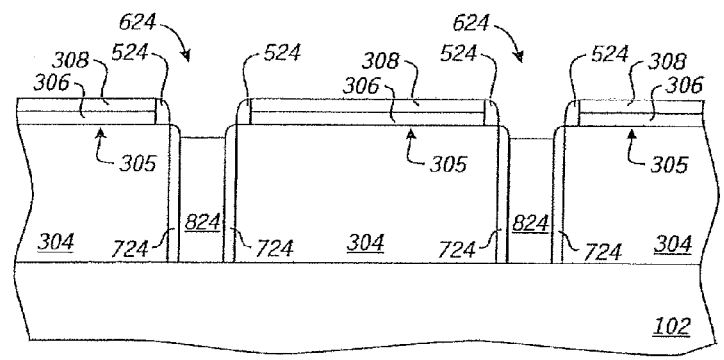

A portion of the conductive layer that overlies the stopping layer 308 is removed to form conductive structures 824 within the trenches 624, as illustrated in the embodiment of FIG. 8. The removal can be performed using a chemical-mechanical polishing or blanket etching technique. The stopping layer 308 may be used as a polish-stop or etch-stop layer. Polishing or etching may be continued for a relatively short time after the stopping layer 308 is reached to account for a non-uniformity across the workpiece with respect to the thickness of the conductive layer, non-uniformity of the polishing or etching operation, or any combination thereof. A continued etch or other removal operation can be used to recess the conductive structures 824 further into the trenches 624, as illustrated in FIG. 8, if needed or desired. The recessed conductive structures 824 may allow the vertical isolation regions 724 and conductive structures 824 to be electrically connected to one another more readily. The conductive structures 824 form vertically conductive regions. When in the form of a finished electronic device, the combination of conductive structures 824 and buried conductive region 102 electrically connects the source of the high-side power transistor to the drain of the low-side power transistor.

Figure 9:
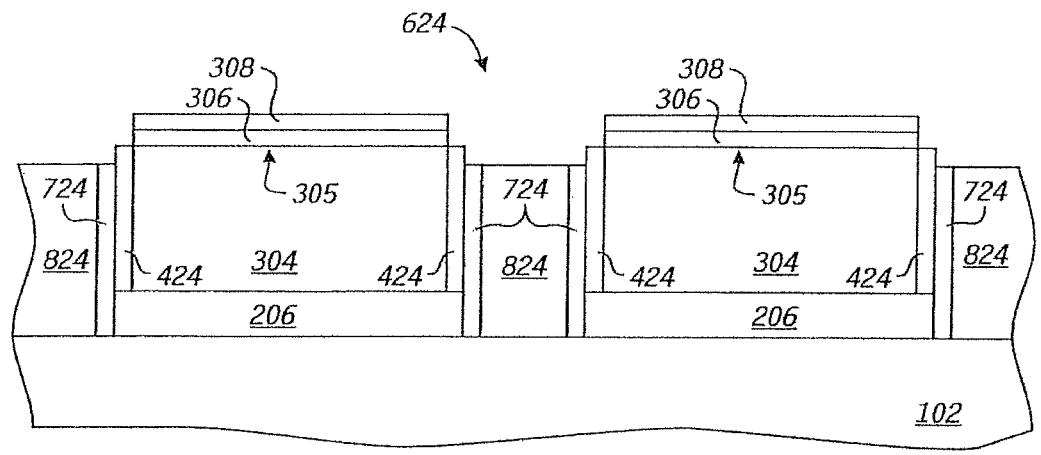
FIG. 9 includes an illustration of a cross-sectional view of the workpiece of FIG. 8 after removing sidewall spacers adjacent to the pad and stopping layers and after removing portions of the insulating spacers lying at elevations above the conductive structures.
Figure 9:
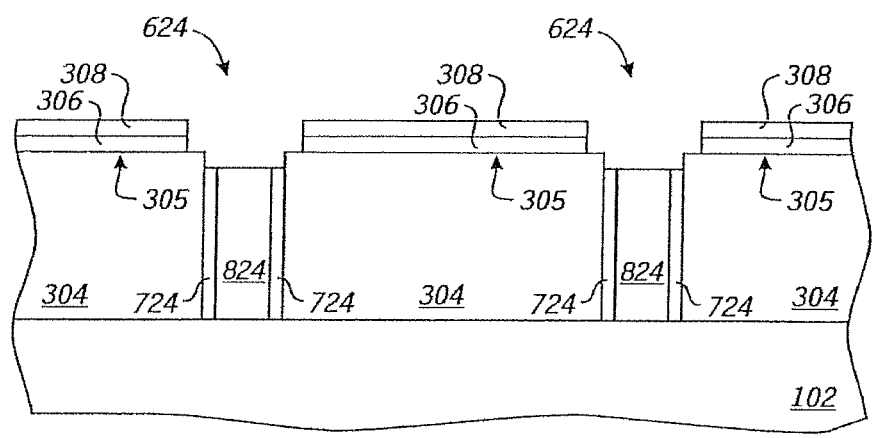

The sidewall spacers 524 and exposed portions of the insulating sidewall spacers 724 within the trenches 624 are removed, as illustrated in FIG. 9. The removal can be performed using an isotropic etching technique using a wet or dry etchant. In a particular embodiment, the sidewall spacers 524 and the insulating sidewall spacers 724 include an oxide, and the stopping layer 308 includes a nitride, and therefore, the sidewall spacers 524 and the insulating sidewall spacers 724 can be selectively removed without removing a substantial amount of the stopping layer 308. At this point in the process, portions of the semiconductor layer 304, the vertical isolation regions 724, and the conductive structures 824 are exposed.

In another embodiment (not illustrated), within the low-side power transistor, portions of the semiconductor layer 304 near the trenches 624 may be doped to form part of the drain regions for the low-side power transistor. A mask may be formed over the high-side power transistor to reduce the likelihood of counter doping the vertical isolation regions 424 within the high-side power transistor. After portions of the semiconductor layer 304 are doped, the mask is removed. An optional oxidation operation can be performed to help round the upper corners of the semiconductor layer 304.

Figure 10:
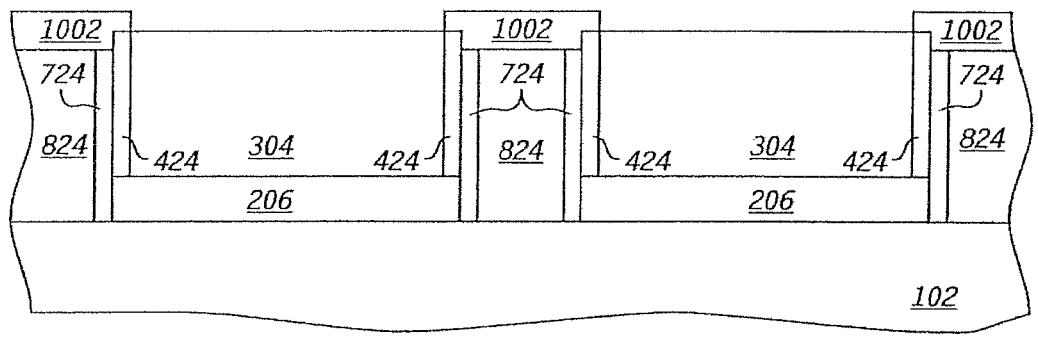
FIG. 10 includes an illustration of a cross-sectional view of the workpiece of FIG. 9 after forming conductive plugs and removing remaining portions of the pad and stopping layers.
Figure 10:
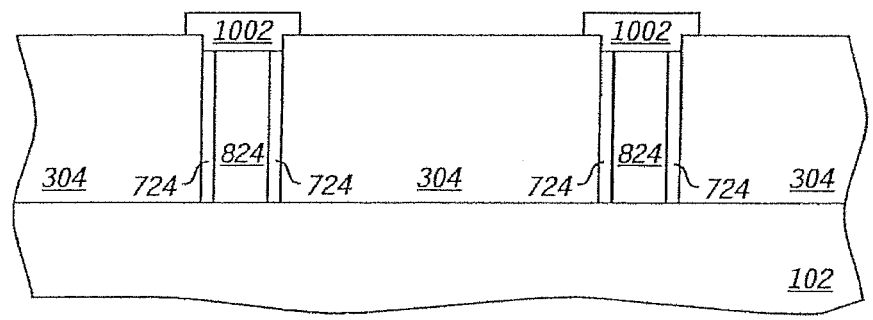

In FIG. 10, conductive plugs 1002 are formed to electrically connect the conductive structures 824 to the vertical isolation regions 724 and the semiconductor layer 304 or doped regions within the semiconductor layer 304. The conductive plugs 1002 can be formed using any of the materials and methods of formation for the conductive structures 824, except that the conductive plugs 1002 are not recessed within the trenches 624. The conductive plugs 1002 and conductive structures 824 may include the same material or different materials and may be formed using the same technique or different techniques. The pad layer 306 and the stopping layer 308 may be removed at this point in the process.

Figure 11:
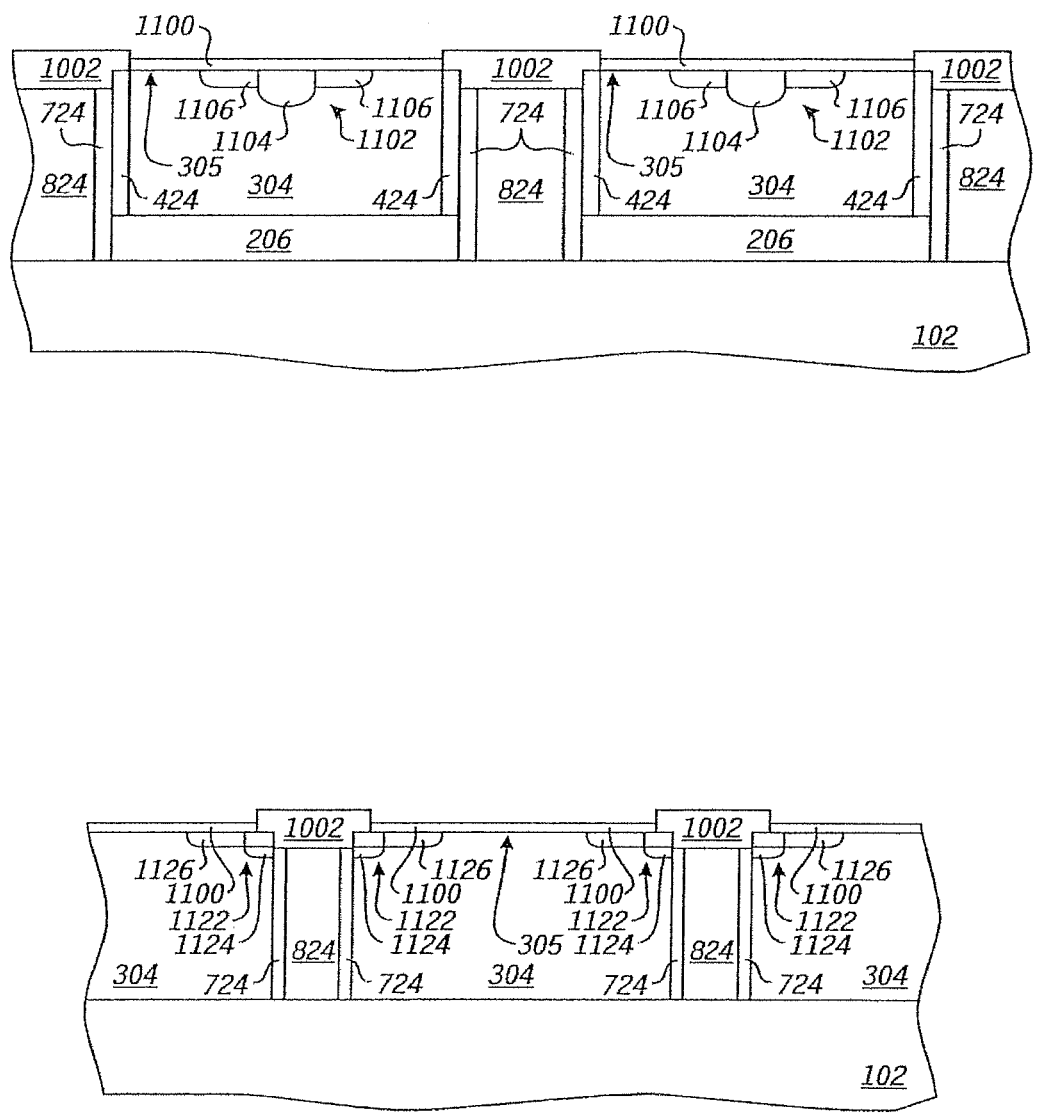
FIG. 11 includes an illustration of a cross-sectional view of the workpiece of FIG. 10 after forming an implant screen layer and drain regions.

An implant screen layer 1100 is formed over the primary surface 305, as illustrated in FIG. 11. The implant screen layer 1100 can include an oxide, a nitride, or an oxynitride and may have a thickness in a range of approximately 2 nm to approximately 50 nm. The implant screen layer 1100 can be formed by a thermal growth or deposition technique.

Drain regions 1102 and 1122 are formed within the semiconductor layer 304 for the high-side and low-side power transistors, respectively. Each of the drain regions 1102 includes a relatively higher dopant concentration and deeper portion 1104 and a relatively lighter dopant concentration and shallower portion 1106, and each of the drain regions 1122 includes a relatively higher dopant concentration and deeper portion 1124 and a relatively lighter dopant concentration and shallower portion 1126. In another embodiment, the deeper portion 1124 of the drain region 1122 may be omitted from the low-side power transistor.

The portions 1104 and 1124 are highly conductive and are designed to be at a high voltage, and the portions 1106 and 1126 are somewhat more resistive and reduce the voltage near the subsequently-formed gate dielectric layer and gate electrodes. Under normal operating conditions in which a high voltage is applied to the drain of a power transistor, most or all of regions 1106 and 1126 will be depleted of carriers, and most or all of regions 1104 and 1124 will be undepleted of carriers. In a particular non-limiting embodiment, the portions 1106 and 1126 are horizontally-oriented doped regions that are spaced apart from the buried conductive region 102. In a normal operating state, the principal charge carrier (electrons) or current flow through the portions 1106 and 1126 will be in horizontal direction.

The portions 1104 and 1124 can include dopant type opposite that of the vertical isolation regions 424 and have a dopant concentration of at least approximately $10^{19}$ atoms/cm$^3$, and the portions 1106 and 1126 may include dopant type opposite that of the vertical isolation regions 424 and have a dopant concentration of less than approximately $10^{19}$ atoms/cm$^3$ and at least approximately $10^{16}$ atoms/cm$^3$. The portions 1106 and 1126 have depths in a range of approximately 0.1 micron to approximately 0.5 microns, and extend laterally from the portions 1104 and 1124 in a range of approximately 0.2 micron to approximately 2.0 microns. The lateral dimension (from either the vertically-oriented conductive structure or the more heavily doped portions 1104 and 1124) can depend on the voltage difference between the source and drain of the power transistor being formed. As the voltage difference between the source and drain of the transistor increases, the lateral dimension can also increase. In an embodiment, the voltage difference is no greater than approximately 30 V, and in another embodiment, the voltage difference is no greater than approximately 20 V. The peak doping concentration within the portions 1106 and 1126 can be in a range of approximately $2 \times 10^{17}$ atoms/cm$^3$ to approximately $2 \times 10^{18}$ atoms/cm$^3$, and in a particular embodiment, in a range of approximately $4 \times 10^{17}$ atoms/cm$^3$ to approximately $7 \times 10^{17}$ atoms/cm$^3$.

In a particular embodiment, the portions 1104 and 1124 are formed using the same masking layer and the same implant species and other implant parameters compared to each other, and the portions 1106 and 1126 are formed using the same masking layer and the same implant species and other implant parameters compared to each other; however the masking layers and implant species and parameters are different for portions 1104 and 1124 as compared to the portions 1106 and 1126. In subsequent figures, the drain regions 1102 and 1122 are illustrated without differentiating the different portions.

In an alternate embodiment, portions 1106 and 1126 can extend continuously across the length of the unit cell of the transistor (i.e., extend to regions where channel and source regions will be subsequently formed). The doping of the channel region, to be described later, is commensurately increased to counter-dope the portion of the drain region within the channel. The advantage of extending the lightly doped portions 1106 and 1126 of the drain into the channel region is that it reduces or eliminates the impact of misalignment of the drain masking layer. In a further embodiment, this masking layer can be eliminated, allowing the implant that forms regions 1106 and 1126 to be continuous across the entire workpiece.

Figure 12:
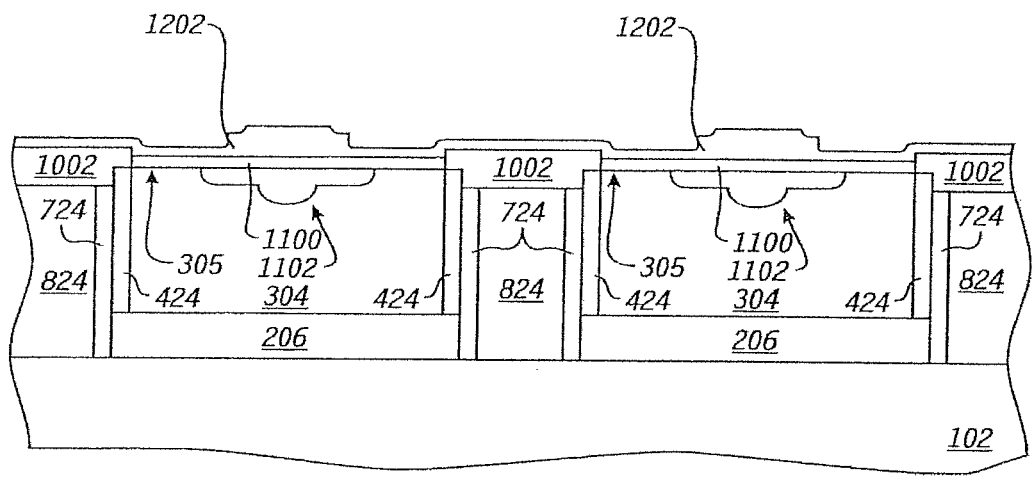
FIG. 12 includes an illustration of a cross-sectional view of the workpiece of FIG. 11 after forming an insulating layer.
Figure 12:
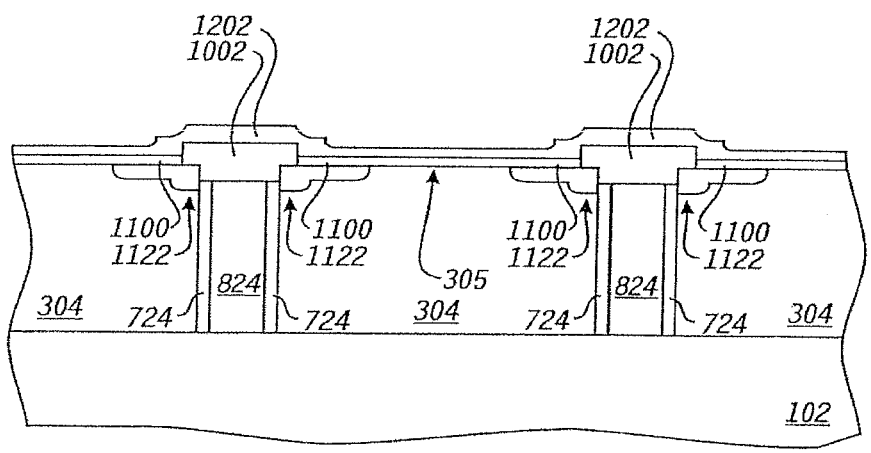

An insulating layer 1202 is formed over the conductive plugs 1002 and the implant screen layer 1100 as illustrated in FIG. 12. The insulating layer 1202 includes at least two different types of regions having different thicknesses. In effect, the insulating layer 1202 has a terraced configuration, the significance of which is described later in this specification. In the embodiment as illustrated in FIG. 12, the insulating layer 1202 includes three regions each having a different thickness. The thinnest regions overlie the more lightly doped portions (i.e., portions 1106 and 1126 in FIG. 11) of the drain regions 1102 and 1122 and over portions of the semiconductor layer 304 near the primary surface 305 and outside of the drain regions 1102 and 1122. The thickest regions overlie the more heavily doped portions (i.e., portions 1104 and 1124) of the drain regions 1102 and 1122. Intermediate regions may lie between the thinner and thickest regions and are an optional feature.

In an embodiment, the insulating layer 1202 within the thinnest regions have a thickness of at least approximately 0.02 microns or at least approximately 0.05 microns, and in another embodiment, the insulating layer 1202 within the thinnest regions have a thickness no greater than approximately 0.2 microns or no greater than approximately 0.1 microns. In an embodiment, the insulating layer 1202 within the thickest regions have a thickness of at least approximately 0.15 microns or at least approximately 0.25 microns, and in another embodiment, the insulating layer 1202 within the thickest regions have a thickness no greater than approximately 0.8 microns or no greater than approximately 0.5 microns. The intermediate regions (between the thinner and thickest regions) may have a thickness substantially the same as the thinnest region or the thickest region or a thickness in between that of the thinner and thickest regions. In an embodiment, the insulating layer 1202 within the intermediate regions have a thickness of at least approximately 0.05 microns or at least approximately 0.15 microns, and in another embodiment, the insulating layer 1202 within the intermediate regions have a thickness no greater than approximately 0.5 microns or no greater than approximately 0.25 microns. In a particular embodiment, the insulating layer 1202 within the thinnest regions have a thickness in a range of approximately 0.03 microns to approximately 0.08 microns, the insulating layer 1202 within the thickest regions have a thickness in a range of approximately 0.3 microns to approximately 0.5 microns, and the insulating layer 1202 within the intermediate regions have a thickness in a range of approximately 0.13 microns to approximately 0.2 microns.

The insulating layer 1202 can be formed by different techniques and achieve different shapes as seen from cross-sectional views. The insulating layer 1202 can be formed from a single insulating film or a plurality of insulating films that are deposited over the workpiece. The single insulating film or the plurality of insulating films can include an oxide, a nitride, an oxynitride, or any combination thereof. In a particular embodiment, the characteristics of the insulating layer 1202 may be different for points closer to the implant screen layer 1100 as compared to corresponding points further from the implant screen layer 1100. In an embodiment, the composition of the insulating layer 1202 may change during or between depositions. For example, an oxide film may be closer to the implant screen layer 1100, and a nitride film may be deposited over the oxide film. In another embodiment, a dopant, such as phosphorus, can be incorporated at an increasing concentration during a later part of the deposition. In still another embodiment, the stress within the film can be changed by changing deposition parameters (e.g., radio frequency power, pressure, etc.) even though the composition is substantially the same throughout the thickness of the insulating layer 1202. In further embodiments, combinations of the foregoing may be used. A mask is formed over the thicker and intermediate region and a patterning technique is used to achieve the desired shape. Those techniques include isotropically etching a portion of the insulating layer 1202, alternative etching the insulating material and etching a sidewall etch of the overlying mask, etching the insulating material and etching a sidewall of the overlying mask, taking advantage of a differential composition (doped oxide etches faster than undoped oxide), patterning followed by formation of a sidewall spacer, another suitable technique, or any combination thereof.

Figure 13:
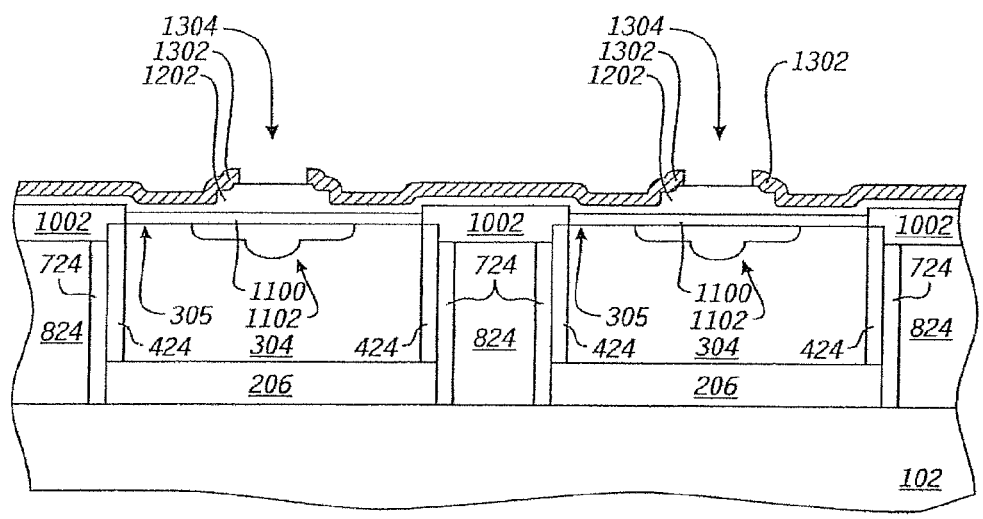
FIG. 13 includes an illustration of a cross-sectional view of the workpiece of FIG. 12 after forming a patterned conductive layer.
Figure 13:
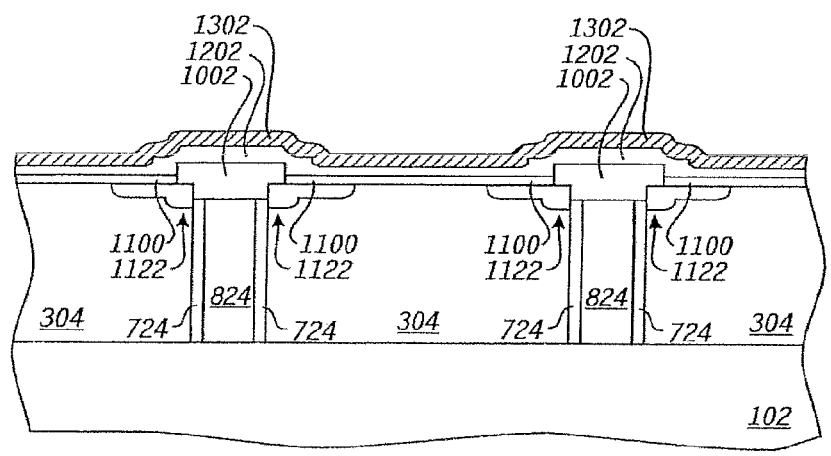

In FIG. 13, a conductive layer 1302 is deposited over the insulating layer 1202 and patterned to form openings 1304 where drain contact structures will be subsequently made to the drain regions 1102 of the high-side power transistors. The conductive layer 1302 includes a conductive material or may be made conductive, for example, by doping. More particularly, the conductive layer 1302 can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer 1302 has a thickness in a range of approximately 0.05 microns to 0.5 approximately microns. In a particular embodiment, the conductive layer 1302 will be used to form a conductive electrode.

Figure 14:
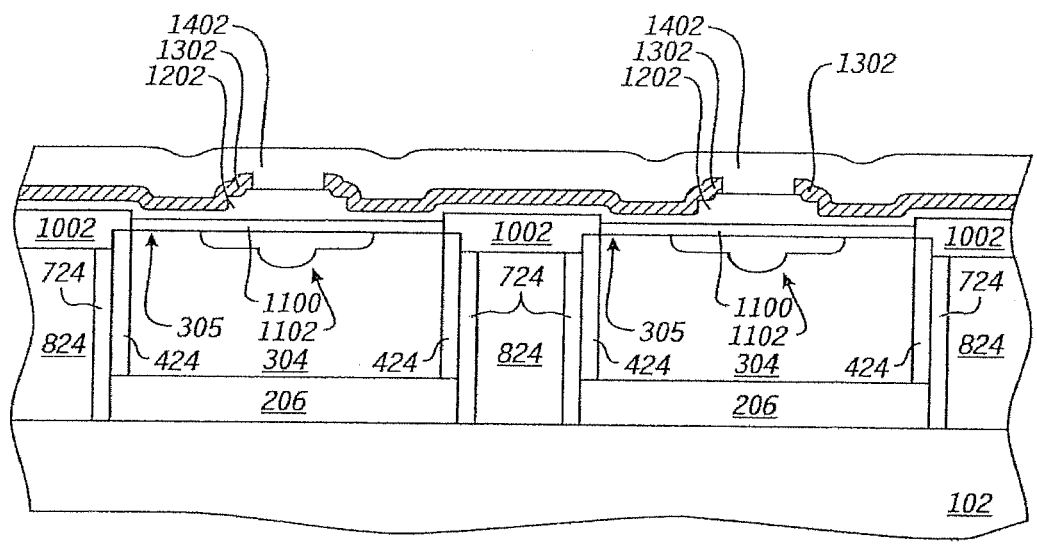
FIG. 14 includes an illustration of a cross-sectional view of the workpiece of FIG. 13 after forming an insulating layer over the patterned conductive layer.
Figure 14:
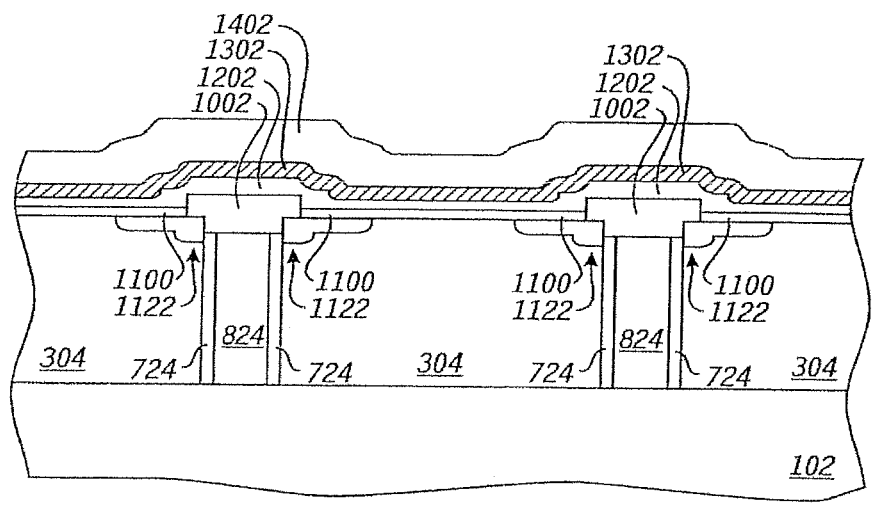

An insulating layer 1402 is formed over the conductive layer 1302, as illustrated in FIG. 14. The insulating layer 1402 can include a single film or a plurality of films. Each film within the insulating layer 1402 can include an oxide, a nitride, an oxynitride, or any combination thereof. In another particular embodiment, a nitride film lies closest to the conductive layer 1302 and has a thickness in a range of approximately 0.05 microns to approximately 0.2 microns. An oxide film overlies the nitride film and has a thickness in a range of approximately 0.2 microns to approximately 0.9 microns. An antireflective film may overlie the oxide film or may be incorporated elsewhere within the insulating layer 1402. For example, the nitride film can be selected with an appropriate thickness to serve as an etch-stop layer and as an antireflective film. In another embodiment, more or fewer films may be used, and thicknesses as described herein are merely illustrative and not meant to limit the scope of the present invention.

Figure 15:
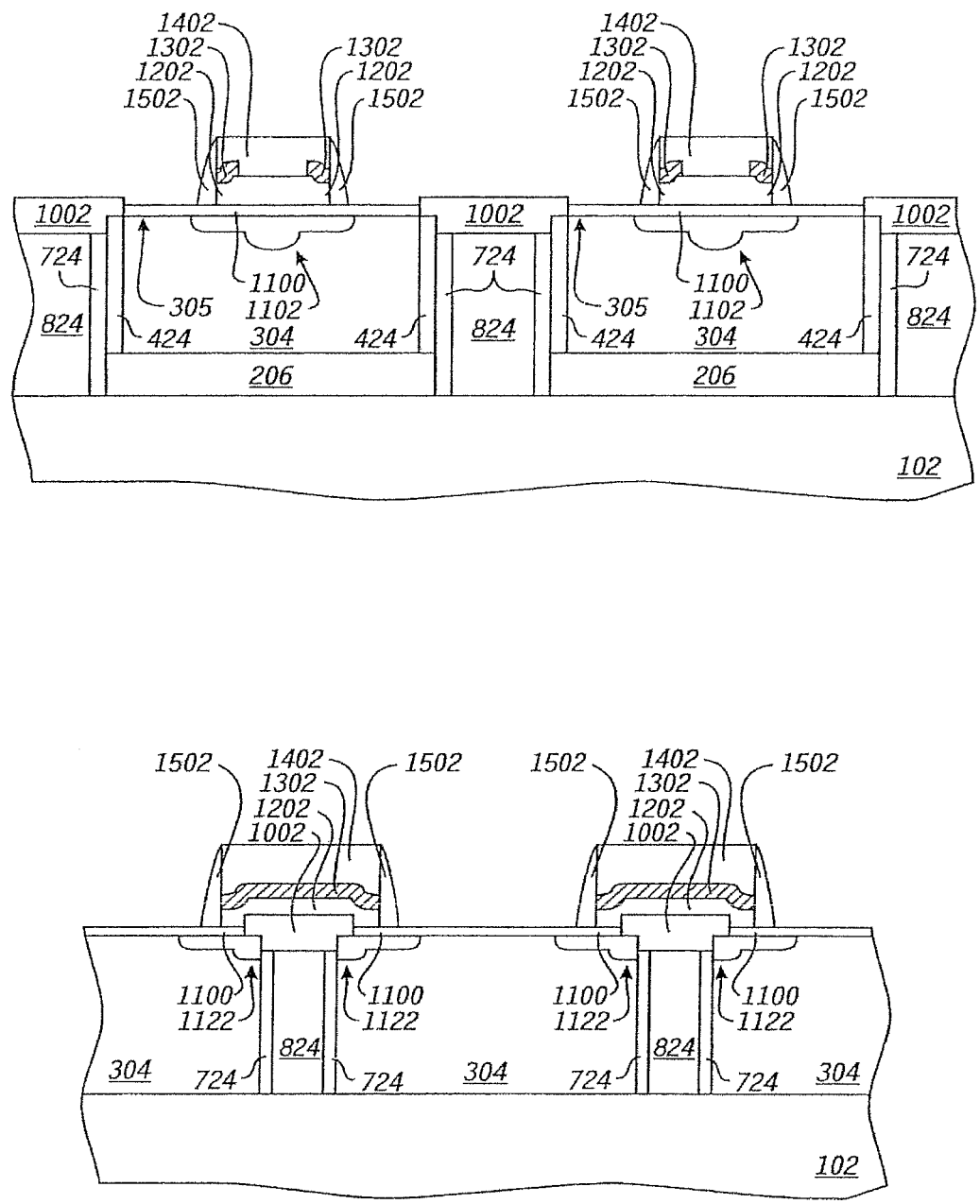
FIG. 15 includes an illustration of a cross-sectional view of the workpiece of FIG. 14 after patterning portions of the insulating and patterned conductive layers and forming sidewall spacers.

The insulating layer 1402, conductive layer 1302, and insulating layer 1202 are patterned to form openings, and insulating spacers 1502 are formed, as illustrated in FIG. 15. The openings are formed such that portions of the drain regions 1102 and 1122 underlie the openings. Such portions (i.e., portions 1106 and 1126 as illustrated in FIG. 11) allow part of the drain regions 1102 and 1122 to underlie part of a subsequently-formed gate electrode. Insulating spacers 1502 are formed along sides of the openings. The insulating spacers 1502 electrically insulate the conductive layer 1302 from a subsequently-formed gate electrode. The insulating spacers 1502 can include an oxide, a nitride, an oxynitride, or any combination thereof, and have widths at the bases of the insulating spacers 1502 in a range of approximately 50 nm to approximately 200 nm.

Figure 16:
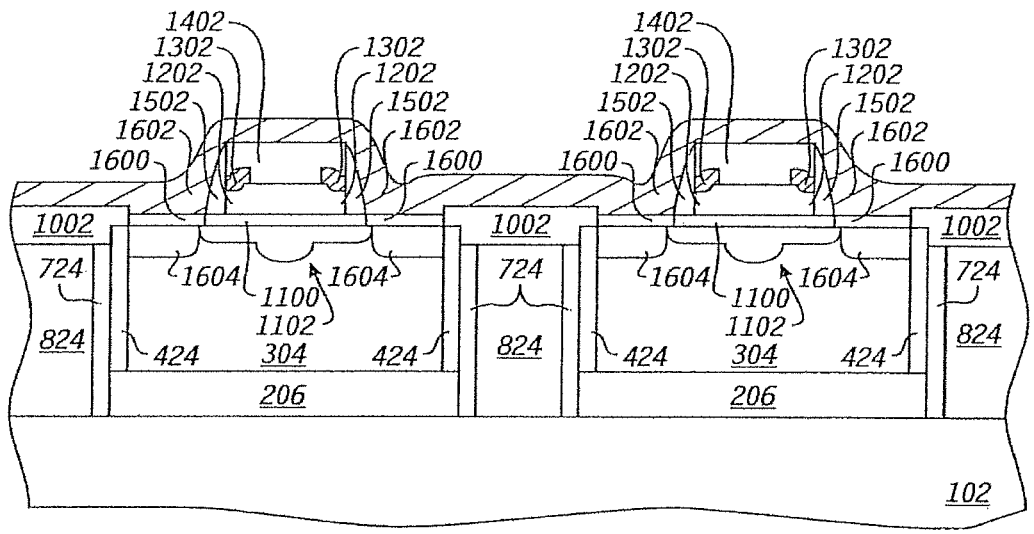
FIG. 16 includes an illustration of a cross-sectional view of the workpiece of FIG. 15 after forming another conductive layer and well regions.
Figure 16:
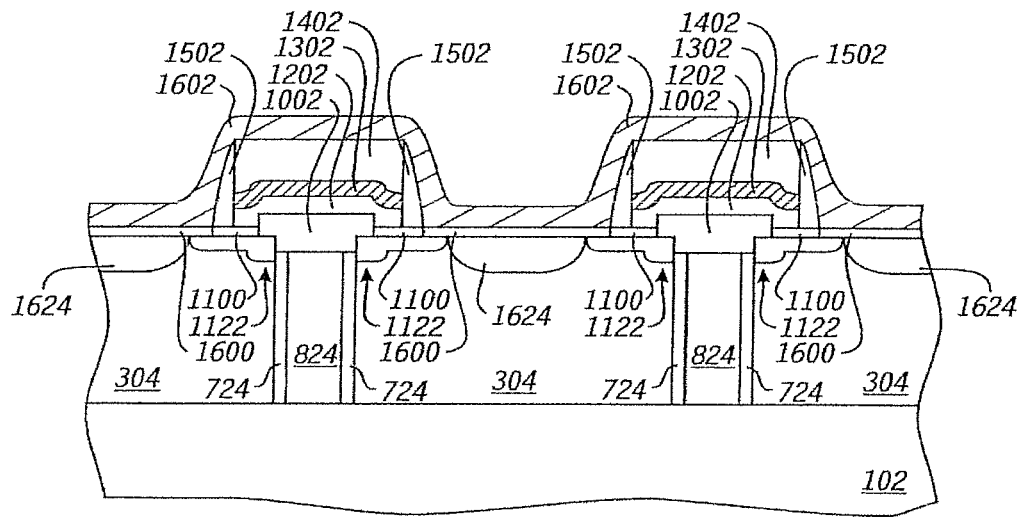

FIG. 16 includes an illustration of the workpiece after forming a gate dielectric layer 1600, a conductive layer 1602, and well regions 1604 and 1624. Portions of the implant screen layer 1100 are removed by etching, and the gate dielectric layer 1600 is formed over the exposed surface of the workpiece. In a particular embodiment, the gate dielectric layer 1600 includes an oxide, a nitride, an oxynitride, or any combination thereof and has a thickness in a range of approximately 5 nm to approximately 100 nm. The conductive layer 1602 overlies the gate dielectric layer 1600 and can be part of subsequently-formed gate electrodes. The conductive layer 1602 can be conductive as deposited or can be deposited as a highly resistive layer (e.g., undoped polysilicon) and subsequently made conductive. The conductive layer 1602 can include a metal-containing or semiconductor-containing material. In one embodiment, the thickness of the conductive layer 1602 is selected such that, from a top view, substantially vertical edges of the conductive layer 1602 are near the edge of the drain regions 1102 and 1122. In an embodiment, the conductive layer 1602 is deposited to a thickness of approximately 0.1 microns to approximately 0.15 microns.

After the conductive layer 1602 is formed, the semiconductor layer 304 can be doped to form well regions 1604 in FIG. 16. The conductivity type of the well regions 1604 and 1624 are opposite that of the drain regions 1102 and 1122 and buried conductive region 102. In an embodiment, boron dopant is introduced through the conductive layer 1602 and the gate dielectric layer 1600 into semiconductor layer 304 to provide p-type dopant for the well regions 1604 and 1624. In one embodiment, the well regions 1604 have depths greater than a depth of subsequently-formed source regions, and in another embodiment, the well regions 1604 and 1624 have depths of at least approximately 0.3 microns. In a further embodiment, the well regions 1604 and 1624 have depths no greater than approximately 2.0 microns, and in still another embodiment, no greater than approximately 1.5 microns. By way of example, the well region 1604 and 1624 can be formed using two or more ion implantations. In a particular example, each ion implantation is performed using a dose of approximately $1.0 \times 10^{13}$ atoms/cm$^2$, and the two implants having energies of approximately 25 KeV and approximately 50 KeV. In another embodiment, more or fewer ion implantations may be performed in forming the well regions. Different doses may be used at the different energies, higher or lighter doses, higher or lower energies, or any combination thereof may be used to meet the needs or desires for a particular application.

In an alternate embodiment (not illustrated), the dose of the ion implantation forming well regions 1604 and 1624 is increased to compensate for the drain regions 1102 and 1122 when portions of lightly doped regions 1106 and 1126 extend across the unit cell of the transistor. In still another embodiment, conductive layer 1602 is not deposited, and the implant of forming well regions 1604 and 1624 uses sidewall spacers 1502 as a hardmask edge instead. In a further particular embodiment, these two embodiments can be combined.

Figure 17:
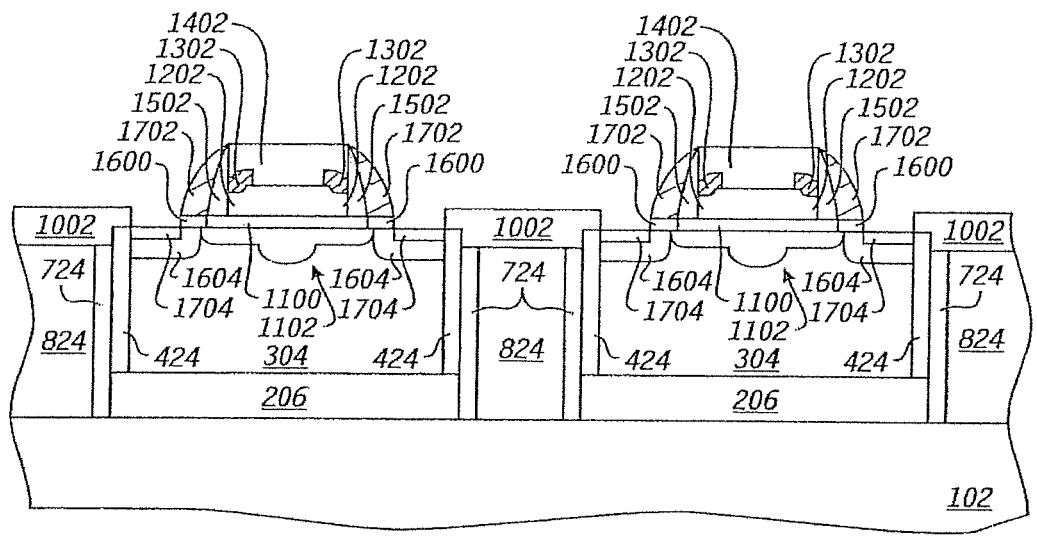
FIG. 17 includes an illustration of a cross-sectional view of the workpiece of FIG. 16 after forming a remaining portion of the conductive layer, etching the resulting conductive layer to form a gate electrode, and forming source regions.
Figure 17:
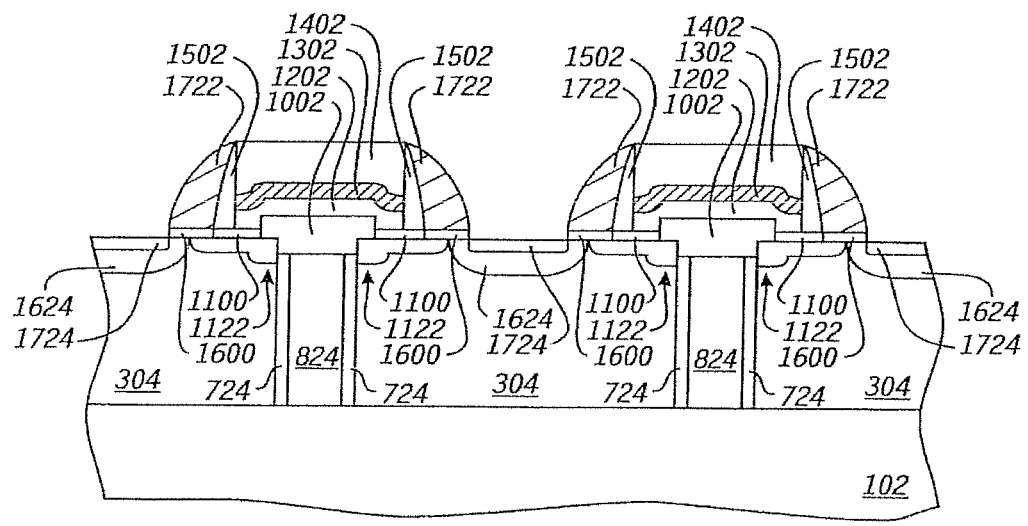

Additional conductive material is deposited on the conductive layer 1602 and etched to form to gate electrodes 1702 and 1722, as illustrated in FIG. 17. The additional conductive material can include any of the materials previously described with respect to the conductive layer 1602. Similar to the conductive layer 1602, the additional conductive material can be conductive as deposited or can be deposited as a highly resistive layer (e.g., undoped polysilicon) and subsequently made conductive. As between the conductive layer 1602 and additional conductive material, they can have the same composition or different compositions. The thickness of the composite conductive layer, including the conductive layer 1602 and the additional conductive material, has a thickness in a range of approximately 0.15 microns to approximately 0.5 microns. When layer 1602 is not present in the workpiece, the widths of the gate electrodes 1702 and 1722 (as measured along their bases) is defined by the thickness of a single conductive layer. In a particular embodiment, the additional conductive material includes polysilicon and can be doped with an n-type dopant during deposition or doped subsequently using ion implantation or another doping technique. The composite conductive layer is anisotropically etched to form gate electrodes 1702 and 1722. In the illustrated embodiment, the gate electrodes 1702 and 1722 are formed without using a mask and have shapes of sidewall spacers. An insulating layer (not illustrated) may be thermally grown from the gate electrodes 1702 and 1722 or may be deposited over the workpiece. The thickness of the insulating layer can be in a range of approximately 10 nm to approximately 30 nm.

Source regions 1704 and 1724 can be formed using ion implantation. The source regions 1704 and 1724 are heavily doped and have an opposite conductivity type as compared to the well regions 1604 and 1624 and the same conductivity type as the drain regions 1102 and 1122 and the buried conductive region 102. The portions of the well regions 1604 lying between the source regions 1704 and drains 1102 and underlying the gate electrodes 1702 are channel regions for the high-side power transistors, and the portions of the well regions 1624 lying between the source regions 1724 and drains 1122 and underlying the gate electrodes 1722 are channel regions for the low-side power transistors.

Figure 18:
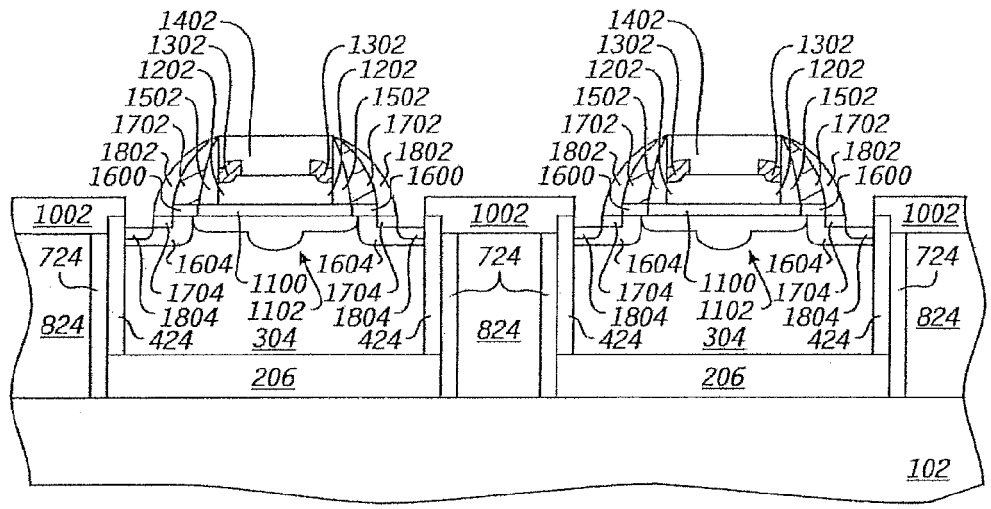
FIG. 18 includes an illustration of a cross-sectional view of the workpiece of FIG. 17 after forming sidewall spacers, etching portions of the source regions, and forming well contact regions.
Figure 18:
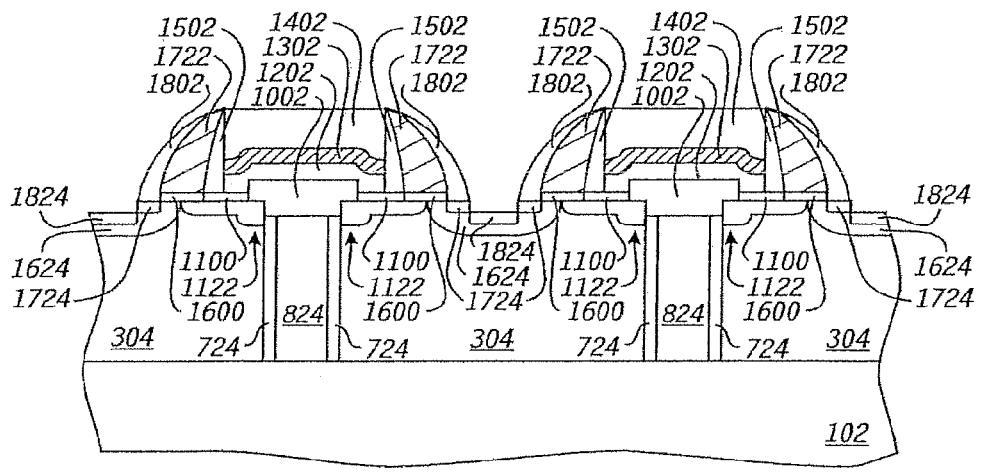

Well contact regions 1804 and 1824 are formed within the well regions 1604 and 1624, respectively, as illustrated in FIG. 18. Insulating spacers 1802 are formed along the gate electrodes 1702 and 1722 and cover portions of the source regions 1704 and 1724 closer to the gate electrodes 1702 and 1722, wherein exposed portions (not illustrated in FIG. 18) of the source regions 1704 and 1724 lie closer to the conductive plugs 1002. The insulating spacers 1802 can include an oxide, a nitride, an oxynitride, or any combination thereof, and have widths at the bases of the insulating spacers 1802 in a range of approximately 50 nm to approximately 500 nm.

The exposed portions of the source regions 1704 and 1724 are etched to expose underlying portions of the well regions 1604 and 1624, respectively. Depending on the composition of the conductive plugs, portions of the conductive plugs 1002 may or may not be etched when the source regions 1704 and 1724 are etched. If the conductive plugs 1002 and the semiconductor layer 304 (from which the well regions 1604 and 1624 and the source regions 1704 and 1724 are formed) are principally silicon, then part or all of the conductive plugs 1002 may be etched when etching through the source regions 1704 and 1724. If the conductive plugs 1002 and source regions 1704 and 1724 include dissimilar materials, substantially none or an insignificant portion of the conductive plugs 1002 may be etched when etching through the source regions 1704 and 1724.

Well contact regions 1804 and 1824 are formed from the exposed portions of the well regions 1604 and 1624, respectively. The well contact regions 1804 and 1824 have the same conductivity type as the well regions 1604 and 1624 and have the opposite conductivity type as compared to the source regions 1704 and 1724. In a particular embodiment, the well contact regions 1804 and 1824 have a dopant concentration of at least approximately $10^{19}$ atoms/cm$^3$ to allow ohmic contacts to be subsequently formed.

In another embodiment (not illustrated), an additional implant (not illustrated) of the same conductivity type as the well regions 1604 and 1624 and of the opposite conductivity type as the source regions 1704 and 1724 may be used to form well contact regions below the source regions 1704 and 1724. The additional implant may be performed before or after forming the source regions 1704 and 1724 and before forming the insulating spacers 1802. In this embodiment, the well contact regions underlie substantially all of the source regions 1704 and 1724. After the source regions 1704 and 1724 and the well contact regions are formed, the insulating spacers 1802 are formed such that only portions of the source regions 1704 and 1724 are covered. An etch as previously described is performed to remove portions of the source regions 1704 and 1724 and expose portions of the underlying well contact regions.

Figure 19:
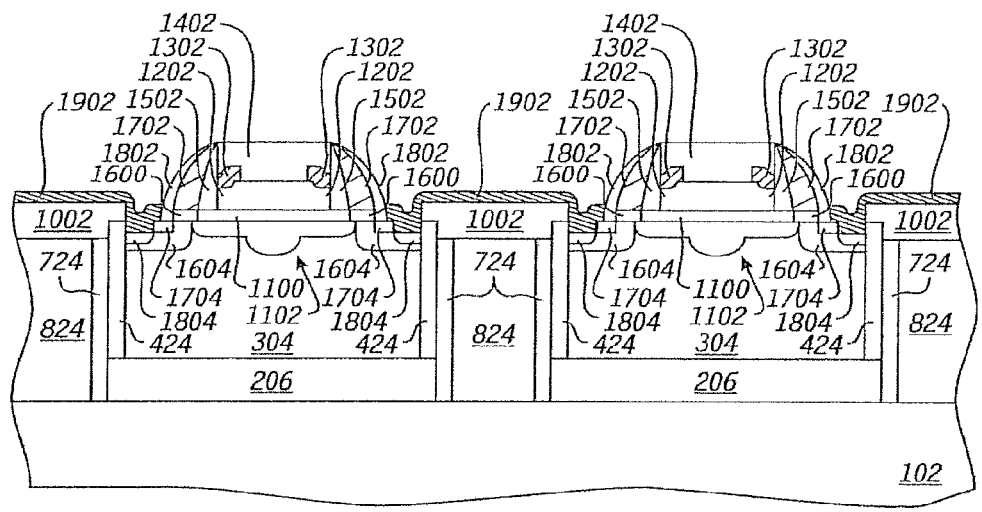
FIG. 19 includes an illustration of a cross-sectional view of the workpiece of FIG. 18 after forming conductive straps to the source regions, well contact regions, and conductive plugs.
Figure 19:
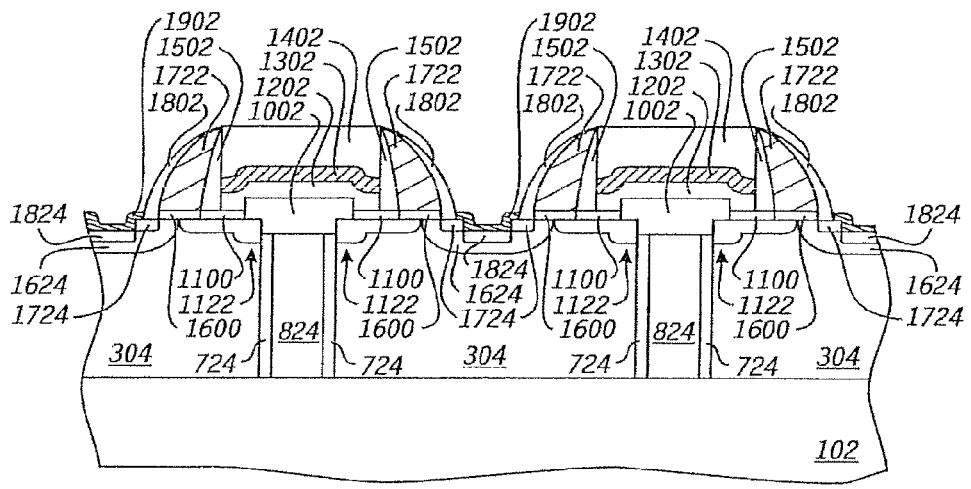

Referring to FIG. 19, portions of the insulating spacers 1802 are etched to expose portions of the source regions 1704 and 1724. Conductive straps 1902 are then formed to electrically connect the source regions 1704, well contact regions 1804, and corresponding conductive plugs 1002 together, and other conductive straps 1902 are formed to electrically connect the source regions 1724 and well contact regions 1824 together. In a particular embodiment, a refractory metal, such as Ti, Ta, W, Co, Pt, or the like, can be deposited over the workpiece and selectively reacted with exposed silicon, such as substantially monocrystalline or polycrystalline silicon, to form a metal silicide. Unreacted portions of the refractory metal overlie the insulating layer 1402 and insulating spacers 1802 are removed, thus leaving the conductive straps 1902. Although not illustrated, an uppermost portion of the gate electrodes 1702 and 1722 may be exposed and react with the refractory metal. However, a metal silicide at such a location is spaced apart from the conductive straps 1902, and therefore, an electrical short is not formed between the gate electrodes 1702 and 1722 and any of the source regions 1704 and 1724 and well contact regions 1804 and 1824. At this point in the process, the high-side and low-side power transistors are formed.

Figure 20:
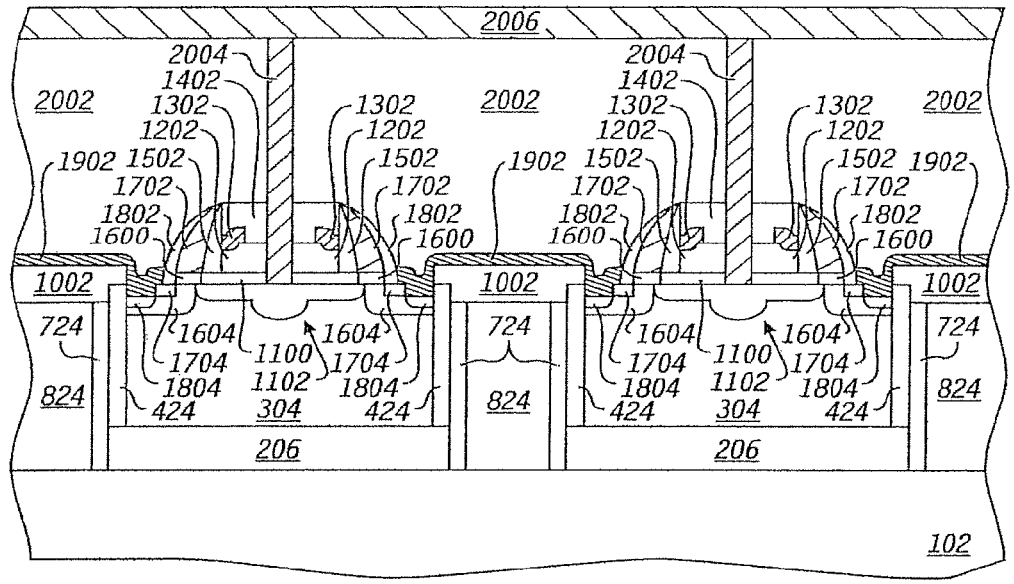
FIG. 20 includes an illustration of a cross-sectional view of the workpiece of FIG. 19 after forming a substantially completed electronic device in accordance with an embodiment of the present invention.
Figure 20:
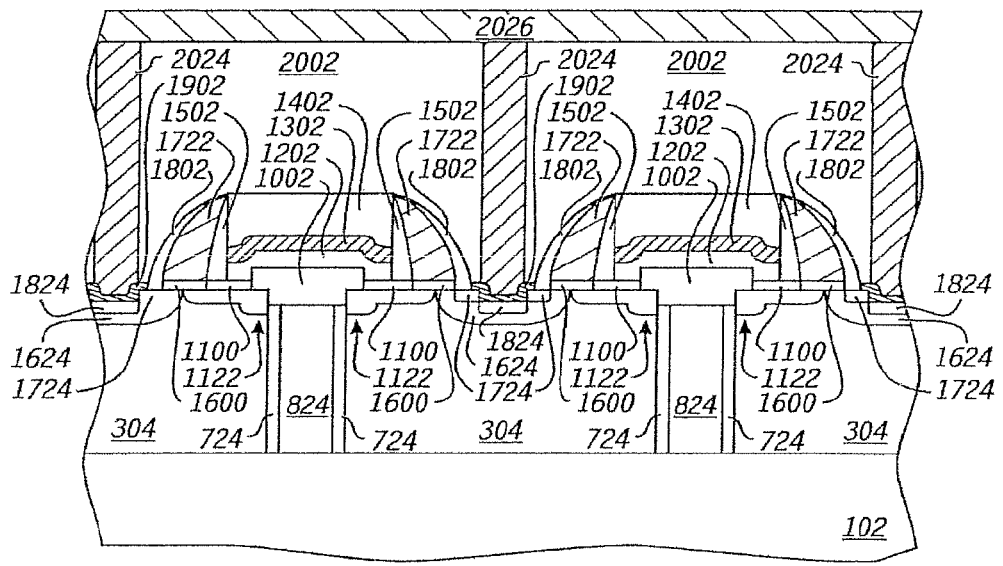

FIG. 20 includes an illustration of a substantially completed electronic device. An interlevel dielectric (ILD) layer 2002 is formed and can include an oxide, a nitride, an oxynitride, or any combination thereof. The ILD layer 2002 can include a single film having a substantially constant or changing composition (e.g., a high phosphorus content further from the semiconductor layer 304) or a plurality of discrete films. An etch-stop film, an antireflective film, or a combination may be used within or over the ILD layer 2002 to help with processing. The ILD layer 2002 may be planarized to improve process margin during subsequent processing operations (e.g., lithography, subsequent polishing, or the like).

A resist layer (not illustrated) is formed over the ILD layer 2002 and is patterned to define resist layer openings. An anisotropic etch is performed to define contact openings that extend through the ILD layer 2002 to expose portions of the drain regions 1102 and conductive straps 1902 as illustrated in FIG. 20. The etch can be performed as a timed etch or as an endpoint detected etch with a timed overetch. The endpoint may be detected when the drain regions 1102 or the conductive straps 1902 become exposed.

Conductive plugs 2004 and 2024 are formed within the contact openings within the ILD layer 2002. The conductive plugs 2004 are electrically connected to the drain regions 1102 of the high-side power transistor, and the conductive plugs 2024 are electrically connected to the source regions 1724 and well contact regions 1824 (via the conductive straps 1902) of the low-side power transistor. An interconnect 2006 overlies the ILD layer 2002 and electrically connects the drain regions 1102 of the high-side power transistors together, and an interconnect 2026 overlies the ILD layer 2002 and electrically connects the source regions 1724 of the low-side power transistors together. Thus, the interconnect 2006 may be coupled to a drain terminal for the electronic device, and the interconnect 2026 can be coupled to a source terminal for the electronic device. Although not illustrated, other conductive members are used to electrically connect the gate electrodes 1702 of the high-side power transistors together, and still other conductive members are used to electrically connect the gate electrodes 1722 of the low-side power transistors together. Furthermore, still other conductive members can be used to electrically connect the conductive layer 1302 to the source regions 1704 of the high-side power transistors, and still other conductive members can be used to electrically connect the conductive layer 1302 to the source regions 1724 of the low-side power transistors. Control logic can be coupled to the gate electrodes 1702 and 1722 to control the operation of the serially-connected high-side and low-side power transistors. The buried conductive region 102 may be coupled to an output terminal for the electronic device.

Although not illustrated, additional or fewer layers or features may be used as needed or desired to form the electronic device. Field isolation regions are not illustrated but may be used to help electrically isolate portions of the high-side power transistors from the low-side power transistors. In another embodiment, more insulating and interconnect levels may be used. For example, a particular interconnect level can be used for the conductive layer 1302 and a different interconnect level can be used to for the gate electrodes 1702 and 1722. A passivation layer can be formed over the workpiece as illustrated in FIG. 20. After reading this specification, skilled artisans will be able to determine layers and features for their particular application.

The electronic device can include many other power transistors that are substantially identical to the power transistors as illustrated in FIG. 20. The high-side power transistors can be connected in parallel to each other, and the low-side power transistors can be connected in parallel to each other. Such a configuration can give a sufficient effective channel width of the electronic device that can support the relatively high current flow that is used during normal operation of the electronic device. In a particular embodiment, each power transistor may be designed to have a maximum source-to-drain voltage difference of approximately 30 V, and a maximum source-to-gate voltage difference of approximately 20 V. During normal operation, the source-to-drain voltage difference is no greater than approximately 20 V, and the source-to-gate voltage difference is no greater than approximately 9 V. The conductive layer 1302 can be kept at a substantially constant voltage with respect to a source terminal of either the high-side or low-side transistor during operation to reduce the drain-to-gate capacitance. In a particular embodiment, the conductive layer 1302 may be at substantially 0 V with respect to a corresponding source terminal, in which case, the conductive layer 1302 can act as a virtual grounding plane. This virtual grounding plane can be at a different potential than the true ground of the application circuit in the case when the source terminal of the corresponding transistor is connected to a switching node in the circuit. In another embodiment, a portion of the conductive layer 1302 near the high-side power transistor may be coupled to the source regions 1704, and another portion of the conductive layer 1302 near the low-side power transistor may be coupled to the source regions 1724.

In accordance with the concepts described herein, an integrated circuit can be formed such that the high-side and low-side power transistors are located within different parts of the same die. A buried conductive region can electrically connect the source of the high-side power transistor to the drain of the low-side power transistor. Parasitic resistance and inductance can be lowered because wire bonds between a die with the high-side power transistor and another die with the low-side power transistor are no longer required.

One particular benefit of reducing the parasitic inductance between the high-side and low-side power transistors is the reduction of ringing of the switching or output node when switching between the high-side and low-side power transistors. During this transient, the parasitic inductance between the high-side and low-side power transistors reacts with the output capacitance of the low-side transistor to form a resonant circuit. This resonant circuit can create undesirable, high frequency voltage swings on the output node of the circuit. These voltage swings can create undesirable voltage stresses on the devices, complicate the control circuitry, and reduce the overall power conversion efficiency of the voltage regulator. Embodiments described herein can enable a reduction in the parasitic inductance between the high-side and low-side power transistors, thereby minimizing output node ringing. Furthermore, the remaining parasitic between the high-side and low-side power transistors is dominated by the resistance of the buried conductive layer, resulting in a more effective damping of the ringing at the output node.

The parasitic resistance between the two transistor types can be reduced even more by combining small high-side and low-side power transistors in pairs, and then connecting multiple pairs of these transistors together in parallel to create a larger effective device. If the average lateral distance between the high-side and low-side power transistors in these pairs is less than the thickness of the buried conductive layer, then current from the high-side transistor does not have to flow through the entire thickness of the buried conductive layer to reach the low-side transistor, thereby reducing the total parasitic resistance.

Figure 21:
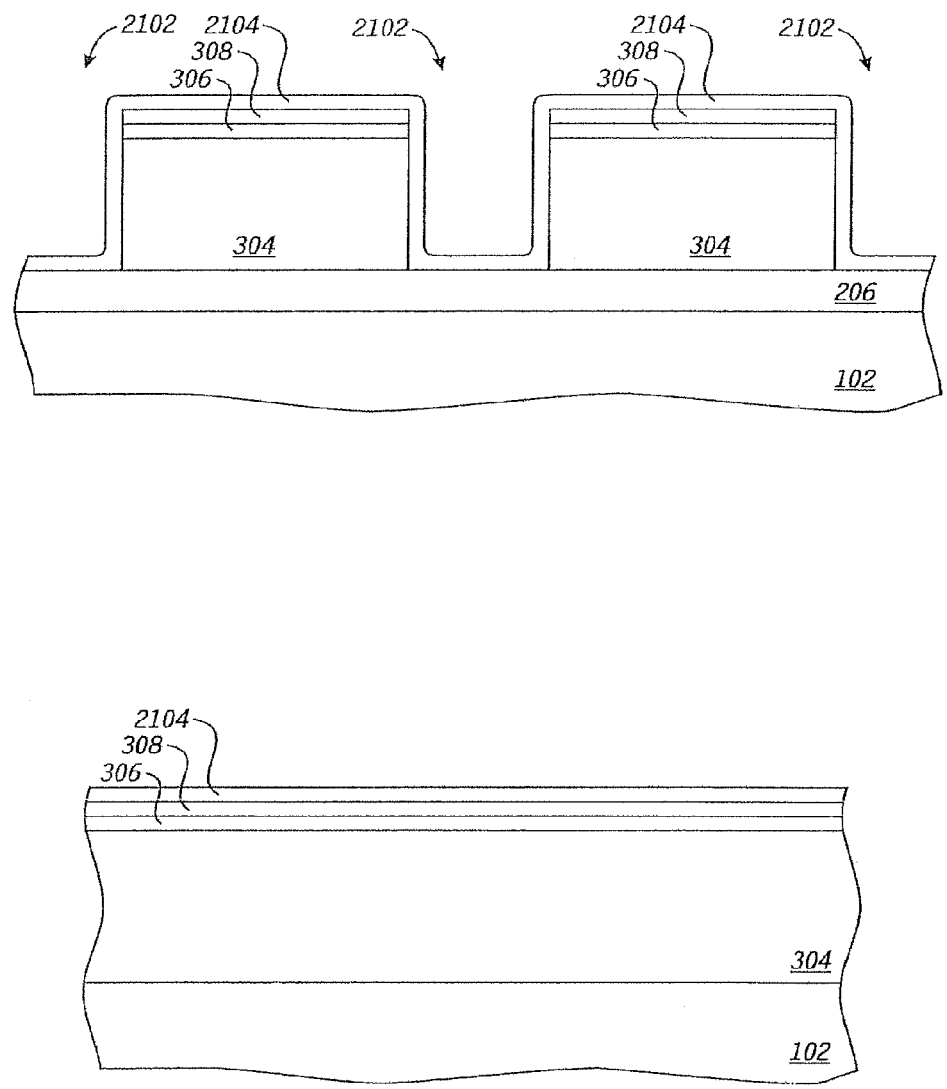
FIGS. 21 to 25 include illustrations of cross-sectional views of a portion of the workpiece of FIG. 3, wherein trenches, vertical isolation regions, and vertical conductive structures are formed in accordance with another embodiment.

Other embodiments can be used if needed or desired. In a particular embodiment, a liner layer may be formed as vertical isolation regions, similar to the vertical isolation regions 424, within the deep trenches before forming conductive structures, similar to the conductive structures 824. Further, the conductive structures may be formed for the high-side power transistors separately from the conductive structures for the low-side power transistors. The starting point for this process is after forming of the semiconductor layer 304, the pad layer 306, and the stopping layer 308, as illustrated in FIG. 3. A mask (not illustrated) is formed over the workpiece, and trenches 2102 for the high-side power transistors are formed and extend completely through the layers 304, 306, and 308, as illustrated in FIG. 21. In another embodiment (not illustrated), the trenches 2102 may extend mostly, but not completely, through the semiconductor layer 304. The low-side power transistors are covered by the mask when the trenches 2102 are formed. A semiconductor layer 2104 is formed along exposed surfaces of the workpiece, including the stopping layer 308 and within the trenches 2102. The semiconductor layer 2104 has a thickness in a range of approximately 20 to 90 nm. The semiconductor layer 2104 can be p-type doped as formed or may be subsequently doped to a doping concentration no less than approximately one order of magnitude lower than the doped buried region 206. In this embodiment, the semiconductor layer 2104 is also formed over the locations for the low-side power transistors.

Figure 22:
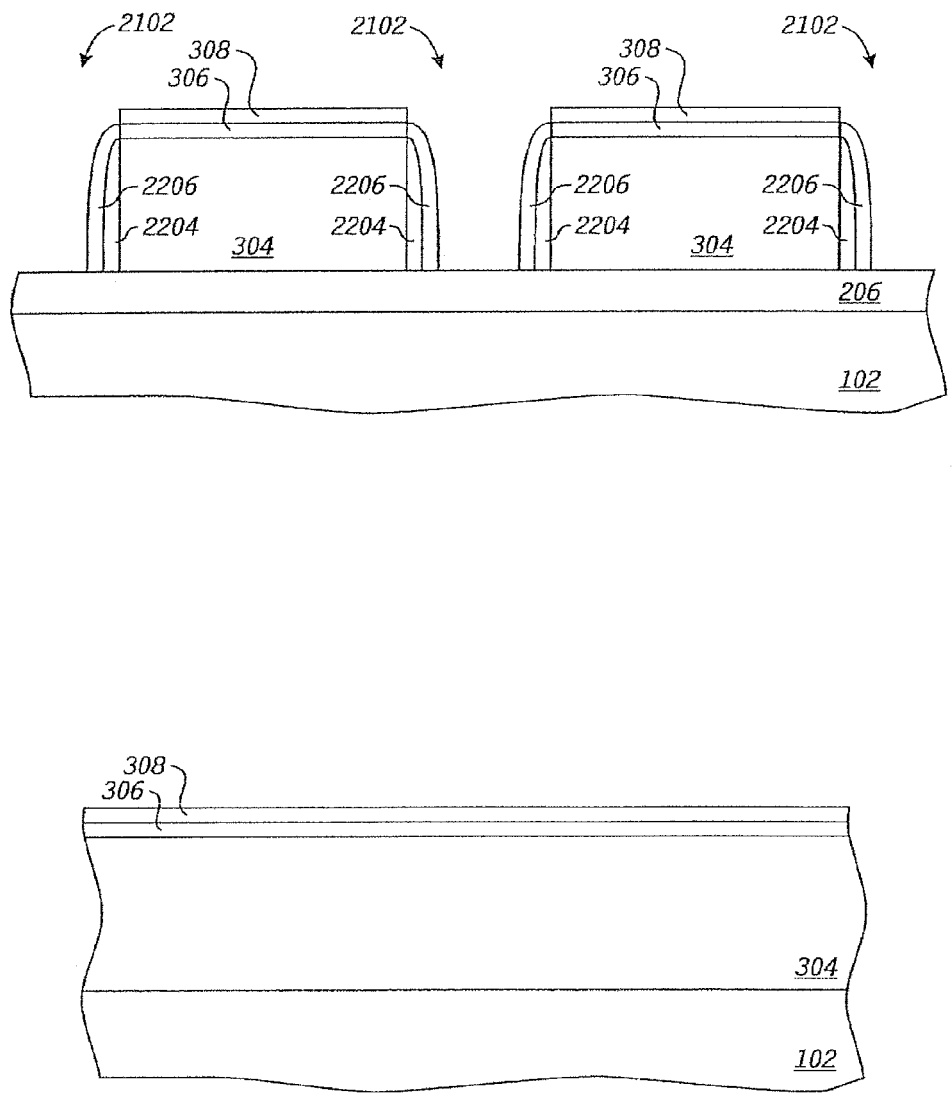

The semiconductor layer 2104 is anisotropically etched and forms vertical isolation regions 2204, as illustrated in FIG. 22. The semiconductor layer 2104 may be amorphous or polycrystalline as deposited. In this embodiment, the vertical isolation regions 2204, which are in the form of sidewall spacers, perform substantially the same function as previously described with respect to the vertical isolation regions 724. The semiconductor layer 2104 is overetched such that the top of the vertical isolation regions 2204 lie at or below the bottom of the pad layer 306. The etching removes the semiconductor layer 2104 from locations where the low-side power transistors will be formed. In another embodiment (not illustrated), a selective growth or other selective formation process may be used to form the vertical isolation regions 2204. The selective process may form the semiconductor layer along exposed semiconductor surfaces, which in this particular embodiment, are along the sidewalls and bottoms of the trenches 2102. In a particular embodiment, such semiconductor layer may be substantially monocrystalline. An anisotropic etch can be used to remove portions of the selectively-formed semiconductor layer lying along the bottoms of the trenches 2102. The stopping layer 308 substantially prevents the selectively-formed semiconductor layer from forming over the semiconductor layer 304 for the high-side and low-side power transistors.

Insulating sidewall spacers 2206 can be formed along the exposed surfaces within the trenches 2102. The insulating sidewall spacers 2206 can include an oxide, a nitride, an oxynitride, or any combination thereof. The layer from which the insulating sidewall spacers 2206 are formed can be thermally grown or deposited, and the layer can be anisotropically etched to remove the layer from the bottoms of the trenches 2102. If needed or desired, an etch can be performed to extend the trenches 2102 closer to or further into the buried conductive region 102. In another embodiment, the insulating sidewall spacers 2206 are omitted.

Figure 23:
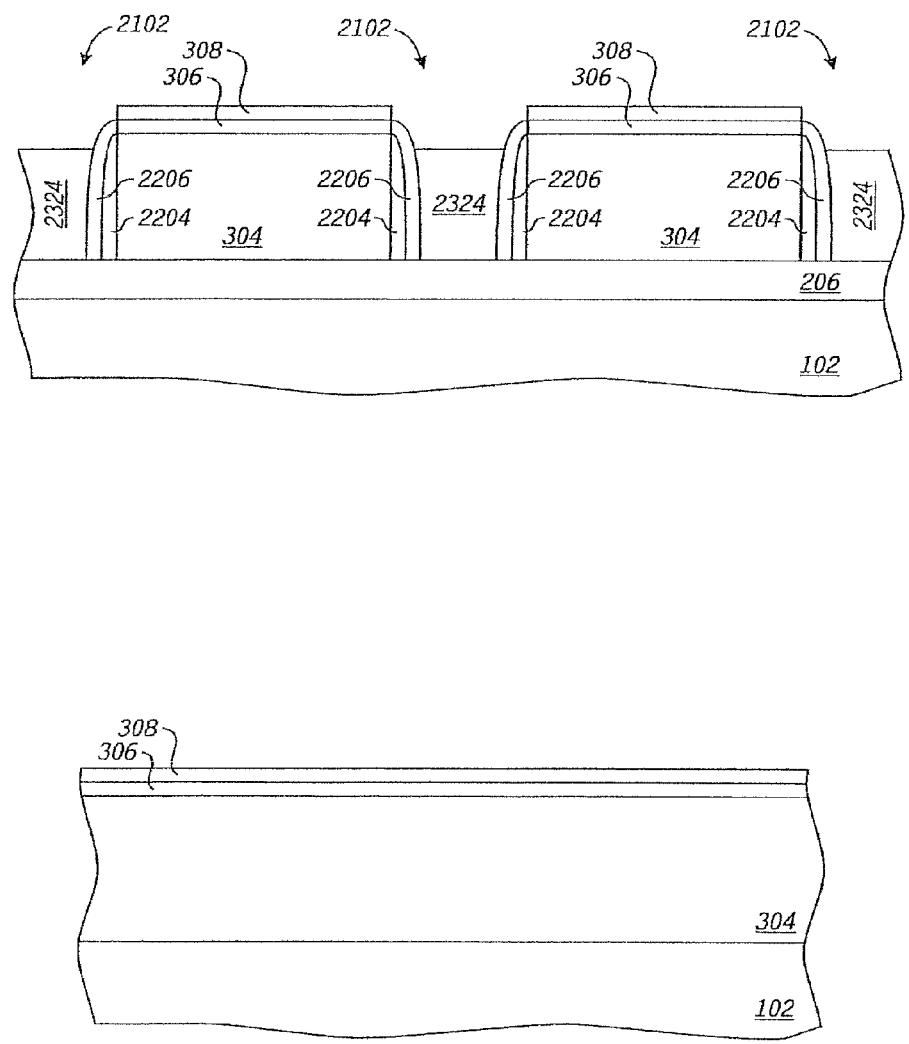

Conductive structures 2324 are formed within the trenches 2102, as illustrated in FIG. 23. The conductive structures 2324 can be formed using any of the materials and techniques as previously described for the conductive structures 824.

Figure 24:
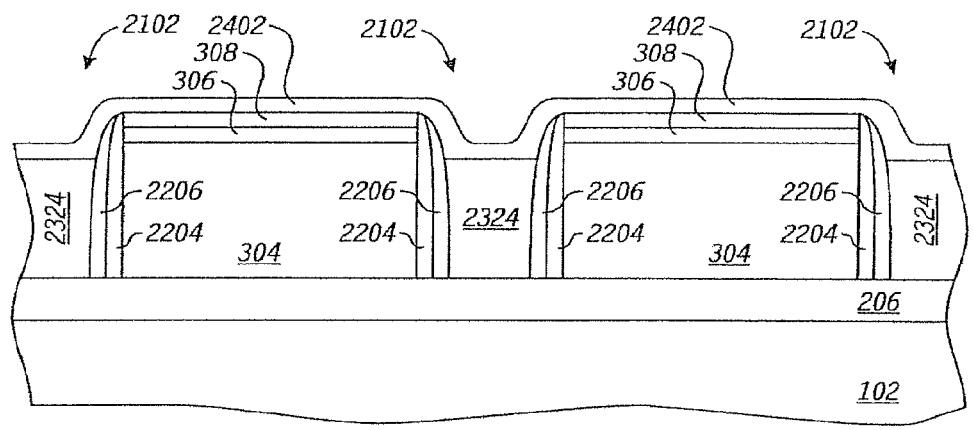
Figure 24:
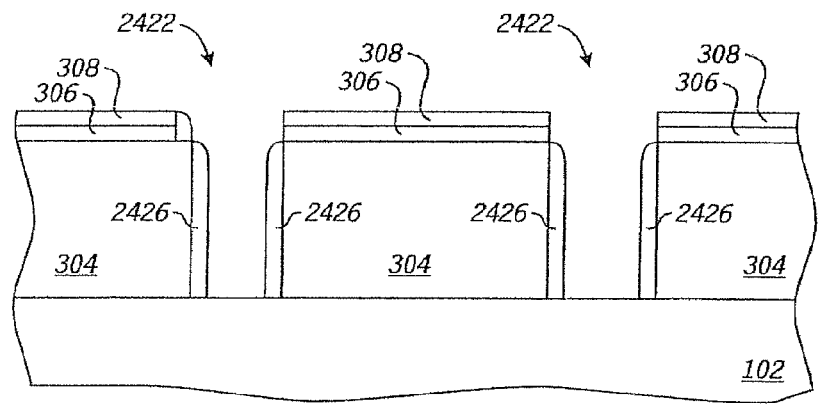

In FIG. 24, a sacrificial protective layer 2402 may be formed over the conductive structures 2324 for the high-side power transistors to protect the conductive structures 2324 and other features within the trenches 2102 from being adversely affected by the formation of corresponding conductive structures for the low-side power transistors. The sacrificial protective layer 2402 can have a different composition as compared to the conductive structures 2324, the insulating spacers 2206, the vertical isolation regions 2204, and the semiconductor layer 304. If each of the conductive structures 2324, the insulating spacers 2206, the vertical isolation regions 2204, and the semiconductor layer 304 includes an oxide, a silicide, or is primarily silicon (i.e., not a silicon oxide or nitride), then the sacrificial protective layer 2402 can include a nitride or an oxynitride. In a particular embodiment, the protective layer 2402 and stopping layer 308 have substantially the same composition. The sacrificial protective layer 2402 can have a thickness in a range of approximately 5 nm to approximately 30 nm.

After the sacrificial protective layer 2402 is formed, trenches 2422 and insulating spacers 2426 may be formed for the low-side power transistors, as illustrated in FIG. 24. The trenches 2422 may be formed using any of the techniques as described with respect to the trenches 2102. The trenches 2422 and 2102 may be formed using the same technique or different techniques. The insulating spacers 2426 may be formed using any of the materials, thicknesses, and techniques as described with respect to the insulating spacers 2206. The insulating spacers 2426 and 2206 may be formed using the same composition or different compositions, substantially the same thickness (widths at the bases) or different thicknesses, and the same formation technique or different formation techniques.

Figure 25:
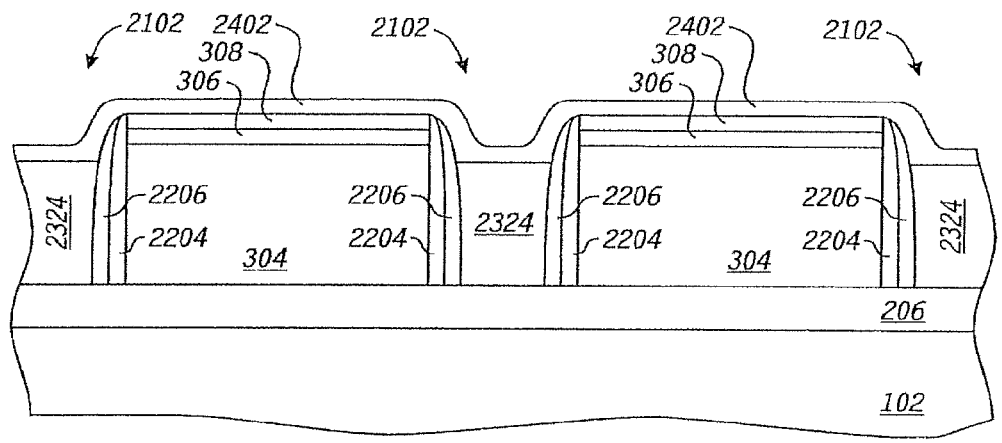
Figure 25:
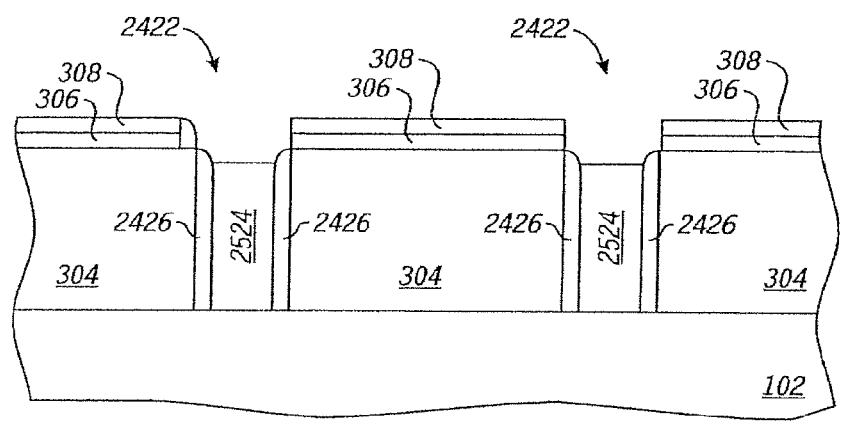

Conductive structures 2524 are formed within the trenches 2422, as illustrated in FIG. 25. The conductive structures 2524 can be formed using any of the materials and techniques as previously described for the conductive structures 824. The conductive structures 2324 and 2524 may be formed using the same composition or different compositions, substantially the same amount of recession within the trenches 2102 and 2422 or different amounts of recession, and the same formation technique or different formation techniques. The sacrificial protective layer 2402 may be removed, and processing continued as previously described with respect to formation of the conductive plugs 1002 and removal of the stopping layer 308 and the pad layer 306 (see FIG. 10).

In another embodiment, the order of forming the features as described with respect to FIGS. 21 to 25 may be reversed. The processing at locations where the low-side power transistors are formed may be performed before processing at locations where the high-side power transistors are formed. In this particular embodiment, the protective sacrificial layer 2402 would be formed over locations where the low-side power transistors are being formed, as opposed to the high-side power transistors.

In still another embodiment, one or more bipolar transistors may be used instead of the field-effect transistors. In this embodiment, current carrying electrodes can include emitters and collectors instead of the sources and drains, and control electrodes can include bases instead of gate electrodes. An emitter of a high-side bipolar transistor can be electrically connected to a collector of a low-side bipolar transistor. If a buried collector is used, the buried collector can be patterned to allow a properly isolated connection to be made to the buried conductive region 102.

Embodiments as described herein may include regions having a peak dopant concentration of less than approximately $10^{19}$ atoms/cm$^3$. Should an ohmic contact with a metal-containing material be needed or desired, a portion of such doped region may be locally doped to have a peak dopant concentration of at least approximately $10^{19}$ atoms/cm$^3$. In a non-limiting example, the buried doped region 206 may have a peak dopant concentration less than approximately $10^{19}$ atoms/cm$^3$. If the conductive structures 824 include W or WSi, portions of the buried doped region 206 near the conductive structures 824, such as along the bottom of the trenches 624, may be implanted to increase locally the peak dopant concentration to be at least approximately $10^{19}$ atoms/cm$^3$ to help form ohmic contacts between the buried doped region 206 and conductive structures 824.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include an integrated circuit comprising a buried conductive region and a semiconductor layer overlying the buried conductive region, wherein the semiconductor layer has a primary surface and an opposing surface, and the buried conductive region lies closer to the opposing surface than to the primary surface. The electronic device can also include a first doped region within the semiconductor layer, wherein the first doped region lies closer to primary surface than to the opposing surface, and a first current-carrying electrode of a first transistor includes the first doped region, wherein the first current-carrying electrode is a source or an emitter and is electrically connected to the buried conductive region. The electronic device can further include a second doped region within the semiconductor layer, wherein the second doped region lies closer to primary surface than to the opposing surface, and a second current-carrying electrode of a second transistor includes the second doped region, wherein the second current-carrying electrode is a drain or a collector and is electrically connected to the buried conductive region.

In an embodiment of the first aspect, the first and second transistors are both n-channel transistors or both p-channel transistors, the first current carrying electrode is a source of the first transistor, and the second current carrying electrode is a drain of the second transistor. In another embodiment, the electronic device further includes a first vertical conductive structure extending through the semiconductor layer and electrically connected to the buried conductive region and the first doped region or the second doped region. In a particular embodiment, the electronic device further includes a second vertical conductive structure extending through the semiconductor layer and electrically connected to the buried conductive region and the second doped region. The first vertical conductor is electrically connected to the buried conductive region and the first doped region, the first doped region is spaced apart from the second doped region, and the first vertical conductive structure is spaced apart from the second vertical conductive structure. In another particular embodiment, the first vertical conductive structure includes a first doped semiconductor region having a same conductivity type as the buried conductive region.

In a further particular embodiment of the first aspect, the electronic device further includes a second doped semiconductor region having an opposite conductivity type as the buried conductive region, wherein the second doped semiconductor region extends through the semiconductor layer. In a more particular embodiment, the semiconductor layer is substantially monocrystalline, and the second doped semiconductor region is polycrystalline. In an even more particular embodiment, the electronic device further includes a second vertical conductive structure extending through the semiconductor layer and electrically connected to the buried conductive region and the second doped region. In a further particular embodiment, the electronic device further includes a first insulating liner lying between the second vertical conductive region and the semiconductor layer, a second insulating liner lying between the first vertical conductive region and the semiconductor layer, or both the first and second insulating liners.

In another more particular embodiment of the first aspect, the second doped semiconductor region has a dopant concentration of at least approximately $1 \times 10^{19}$ atoms/cm$^3$, and the semiconductor layer has a background dopant concentration no greater than approximately $1 \times 10^{17}$ atoms/cm$^3$. In a further embodiment, each of the first transistor and the second transistor is a power transistor.

In a second aspect, a process of forming an electronic device including an integrated circuit can include providing a substrate that includes a first semiconductor layer over a buried conductive region, wherein the first semiconductor layer has a primary surface and an opposing surface, and the buried conductive region lies closer to the opposing surface than to the primary surface. The process can also include forming a first doped region within the semiconductor layer and along the primary surface of the first semiconductor layer, wherein the first doped region is part of a first current-carrying electrode of a first transistor, and the first current-carrying electrode is a source or an emitter. The process can further include forming a first vertical conductive structure extending through the first semiconductor layer; wherein, in a finished device, the buried conductive region, the first vertical conductive structure, and the first doped region are electrically connected to one another. The process can also include forming a second doped region within the first semiconductor layer and along the primary surface of the first semiconductor layer, wherein the second doped region is part of a second current-carrying electrode of a second transistor, and the second current-carrying electrode is a drain or a collector. The process can further include forming a second vertical conductive structure extending through the first semiconductor layer, wherein, in a finished device, the buried conductive region, the second vertical conductive structure, and the second doped region are electrically connected to one another.

In an embodiment of the second aspect, the process further includes forming a first trench extending through the first semiconductor layer before forming the first vertical conductive structure therein, and forming a second trench extending through the first semiconductor layer before forming the second vertical conductive structure therein. In a particular embodiment, forming the first semiconductor layer includes epitaxially growing a substantially monocrystalline semiconductor layer, forming the first vertical conductive region includes depositing a polycrystalline material, and forming the second vertical conductive region includes depositing the polycrystalline material. In another particular embodiment, the process further includes forming a first insulating liner within the second trench. In a more particular embodiment, the process further includes forming a second insulating liner within the first trench.

In a further particular embodiment of the second aspect, the process further includes forming a first doped semiconductor region along a sidewall of the first trench. The first doped semiconductor region has an opposite conductivity type as compared to the buried conductive region and a dopant concentration higher than the first semiconductor layer. A first insulating liner is disposed between the first doped semiconductor region and the first vertical conductive region. In a more particular embodiment, forming the first doped semiconductor region includes depositing a second semiconductor layer along exposed surfaces of the first trench, and anisotropically etching the second semiconductor layer to remove a portion of the second semiconductor layer lying along a bottom of the trench and exposing a portion of the buried conductive region.

In still another particular embodiment of the second aspect, the process further includes implanting a dopant into the first semiconductor layer to form an implanted doped semiconductor region within the first semiconductor layer. The dopant has an opposite conductivity type as compared to the buried region, forming the first trench is performed after forming the implanted doped region, and forming the first vertical conductive region is performed such that the first vertical conductive region is formed within the first trench.

In a further particular embodiment, the process further includes forming a doped semiconductor region, wherein the doped semiconductor region has an opposite conductivity type as compared to the buried conductive region and a dopant concentration higher than the first semiconductor layer, and in a finished device, the doped semiconductor region lies closer to the buried conductive region and an opposing surface of the first semiconductor layer than a primary surface of the first semiconductor layer. In a more particular embodiment, each of the buried conductive region, the first and second doped regions, and the semiconductor doped region has a dopant concentration of at least approximately $1 \times 10^{19}$ atoms/cm$^3$, and the first semiconductor layer has a background dopant concentration no greater than approximately $1 \times 10^{17}$ atoms/cm$^3$. In another embodiment the process further includes forming a horizontally-oriented doped region lying adjacent to the primary surface and the second doped region, wherein the horizontally-oriented doped region is a drift region for the second transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device including an integrated circuit comprising:
    a buried conductive region;
    a semiconductor layer overlying the buried conductive region, wherein the semiconductor layer has a primary surface and an opposing surface, and the buried conductive region lies closer to the opposing surface than to the primary surface;
    a low-side transistor that includes a first current-carrying electrode that is a drain or a collector, wherein:
        the first current-carrying electrode is electrically connected to the buried conductive region and includes a first doped region within the semiconductor layer; and
        the first doped region lies closer to primary surface than to the opposing surface;
    a low-side vertical conductive structure extending through the semiconductor layer and electrically connected to and adjacent to the buried conductive region and to the first doped region; and
    a high-side transistor that includes a second current-carrying electrode that is a source or an emitter, wherein:
        the second current-carrying electrode is electrically connected to the buried conductive region and includes a second doped region within the semiconductor layer; and
        the second doped region lies closer to primary surface than to the opposing surface.

2. The electronic device of claim 1, further comprising a high-side vertical conductive structure extending through the semiconductor layer and electrically connected to and adjacent to the buried conductive region and the second doped region.

3. The electronic device of claim 2, further comprising an insulating sidewall spacer along opposite sides of the high-side vertical conductive structure.

4. The electronic device of claim 3, wherein the high-side transistor further comprises a vertical, doped isolation region, wherein the insulating sidewall spacer is disposed between the high-side vertical conductive structure and the vertical, doped isolation region.

5. The electronic device of claim 4, wherein the low-side transistor does not include a vertical, doped isolation region adjacent to the low-side vertical conductive structure.

6. An electronic device comprising:
    a buried conductive region;
    a semiconductor layer overlying the buried conductive region, wherein the semiconductor layer has a primary surface and an opposing surface, and the buried conductive region lies closer to the opposing surface than to the primary surface;
    a first transistor that includes a first current-carrying electrode that is a drain or a collector, wherein:
        the first current-carrying electrode is electrically connected to the buried conductive region,
        the first-current carrying electrode includes a first doped region within the semiconductor layer; and
        the first doped region lies along the primary surface;
    a first vertical conductive structure extending through the semiconductor layer and electrically connected to and adjacent to the buried conductive region and the first doped region; and
    a first insulating sidewall spacer adjacent to the first doped region and along opposite sides of the first vertical conductive structure.

7. The electronic device of claim 6, further comprising a first conductive plug overlying the first vertical conductive structure, wherein a combination of the first vertical conductive structure and the first conductive plug has a T-shape.

8. The electronic device of claim 7, further comprising a conductive member, wherein the first current-carrying electrode is a drain.

9. The electronic device of claim 8, wherein the conductive member overlies the first conductive plug.

10. The electronic device of claim 8, wherein the first conductive plug has a horizontal surface spaced apart from an uppermost surface of the first conductive plug, wherein the horizontal surface lies at an elevation that is higher than an elevation of an uppermost surface of a well contact region.

11. The electronic device of claim 7, wherein a lowermost portion of the first conductive plug lies at an elevation below the primary surface.

12. The electronic device of claim 6, wherein the electronic device includes an integrated circuit comprising the first transistor and further comprising a second transistor that includes a second current-carrying electrode that is a source or an emitter, wherein:
    the second current-carrying electrode is electrically connected to the first current-carrying region of the first transistor;
    the second-current carrying electrode lies along the primary surface; and
    the first transistor is a low-side transistor, and the second transistor is a high-side transistor.

13. The electronic device of claim 12, further comprising:
    a vertical, doped isolation region; and
    a horizontal doped region that contacts the vertical, doped isolation region, is over the buried conductive region, and is spaced apart from the primary surface,
    wherein the horizontal doped region and the vertical, doped isolation region have a same conductivity type that is opposite a conductivity type of the buried conductive region.

14. The electronic device of claim 12, further comprising a second vertical conductive structure extending through the semiconductor layer and electrically connected to and adjacent to the buried conductive region and the second current-carrying electrode.

15. An electronic device including an integrated circuit comprising:
 a buried conductive region;
 a semiconductor layer overlying the buried conductive region, wherein the semiconductor layer has a primary surface and an opposing surface, and the buried conductive region lies closer to the opposing surface than to the primary surface;
 a low-side transistor that includes a drain region, wherein:
  the drain region is electrically connected to the buried conductive region and includes a first doped region within the semiconductor layer; and
  the first doped region lies closer to the primary surface than to the opposing surface;
 a high-side transistor that includes a source region, wherein:
  the source region is electrically connected to the drain region of the low-side transistor;
  the source region lies closer to the primary surface than to the opposing surface;
 a high-side vertical conductive structure lying between and electrically connecting the source region and the buried conductive region and, from a cross-sectional view, is adjacent to opposite sides of a portion of the semiconductor layer corresponding to the high-side transistor; and
 an insulating sidewall spacer adjacent to the source region of the high-side transistor and laterally disposed between the semiconductor layer and the high-side vertical conductive structure.

16. The electronic device of claim 15, further comprising a vertical, doped isolation region laterally surrounding the high-side vertical conductive structure.

17. The electronic device of claim 16, further comprising a horizontal doped region that is adjacent to the vertical, doped isolation region, over the buried conductive region, and spaced apart from the primary surface, wherein the horizontal doped region and the vertical, doped isolation region have a same conductivity type that is opposite a conductivity type of the buried conductive region.

18. The electronic device of claim 17, wherein a thickness of the horizontal doped region is less than a thickness of the portion of the semiconductor layer overlying the horizontal doped region.

19. The electronic device of claim 17, wherein the horizontal doped region is immediately adjacent to the buried doped region.

* * * * *